United States Patent
Siegert et al.

(10) Patent No.: US 10,181,393 B2
(45) Date of Patent: Jan. 15, 2019

(54) END BLOCK ARRANGEMENT AND SOCKET ARRANGEMENT

(71) Applicant: VON ARDENNE Asset GmbH & Co. KG, Dresden (DE)

(72) Inventors: Sebastian Siegert, Dresden (DE); Gerit Stude, Dresden (DE); Gerd Arnold, Dresden (DE); Hans-Juergen Heinrich, Grossroehrsdorf (DE); Florian Wiegand, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 239 days.

(21) Appl. No.: 14/887,418

(22) Filed: Oct. 20, 2015

(65) Prior Publication Data

US 2016/0111265 A1 Apr. 21, 2016

(30) Foreign Application Priority Data

Oct. 20, 2014 (DE) .......................... 10 2014 115 282

(51) Int. Cl.
*H01J 37/34* (2006.01)
*C23C 14/34* (2006.01)

(52) U.S. Cl.
CPC ...... *H01J 37/3435* (2013.01); *C23C 14/3407* (2013.01); *H01J 37/34* (2013.01)

(58) Field of Classification Search
CPC .... H01J 37/34; H01J 37/3435; C23C 14/3407
See application file for complete search history.

(56) References Cited

U.S. PATENT DOCUMENTS 5,100,527 A * 3/1992 Stevenson ........... C23C 14/3407
                                                              204/298.09
2003/0136672 A1 7/2003 Barrett
(Continued)

FOREIGN PATENT DOCUMENTS

CN 1307671 A 8/2001
CN 1912175 A 2/2007
(Continued)

OTHER PUBLICATIONS

'Play' definition. Merriam-Webster Online Dictionary [https://www.merriam-webster.com/dictionary/play] [Accessed on Apr. 3, 2018].*
(Continued)

*Primary Examiner* — Michael A Band
(74) *Attorney, Agent, or Firm* — Viering Jentschura & Partner MBB

(57) ABSTRACT

According to various embodiments, a socket arrangement for holding an end block on a process chamber may include the following: a first socket element with a first fastening arrangement for fastening the first socket element on a process chamber wall and with a second fastening arrangement; and a second socket element with a third fastening arrangement, for fastening the second socket element on the first socket element and with a fourth fastening arrangement for fastening an end block on the second socket element; wherein the second fastening arrangement of the first socket element and the third fastening arrangement of the second socket element may be formed for engaging in one another with play in such a way that the second socket element may be deflectable in relation to the first socket element.

19 Claims, 12 Drawing Sheets

(56) References Cited

U.S. PATENT DOCUMENTS

| | | | |
|---|---|---|---|
| 2006/0049043 | A1 | 3/2006 | Matuska et al. |
| 2007/0051304 | A1 | 3/2007 | Sauer |
| 2010/0012487 | A1 | 1/2010 | Heinrich et al. |
| 2010/0012489 | A1 | 1/2010 | Heinrich et al. |

FOREIGN PATENT DOCUMENTS

| | | | |
|---|---|---|---|
| CN | 101473405 | A | 7/2009 |
| DE | 102008033902 | A1 | 1/2010 |
| EP | 1752557 | A1 | 2/2007 |
| WO | 3000766 | A1 | 1/2000 |
| WO | 2007147757 | A1 | 12/2007 |

OTHER PUBLICATIONS

Chinese Office Action based on application No. 201510679930.9 (8 pages and 9 pages of English translation) dated Sep. 4, 2017 (Reference Purpose Only).
Belgian Search Report based on Application No. 201505647(2 Pages) dated Jun. 7, 2016 (Reference Purpose Only).
Belgian Search Report based on Application No. 201505647 (3 Pages) dated Jun. 7, 2016 (Reference Purpose Only).

\* cited by examiner

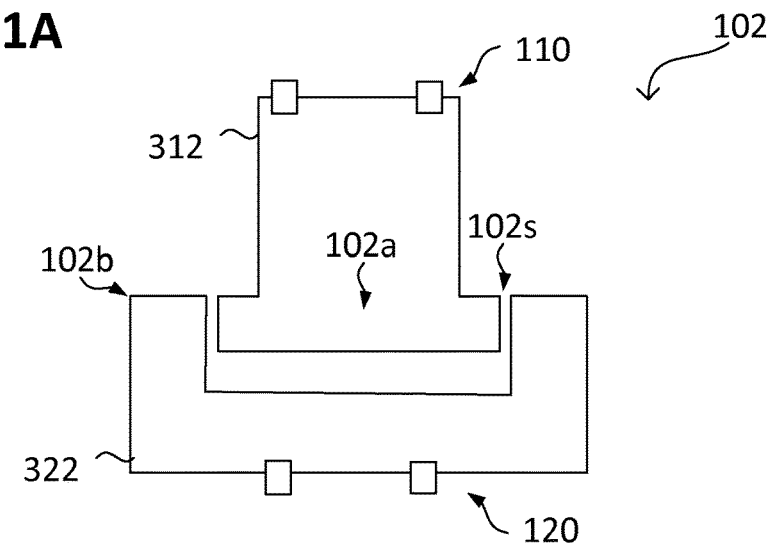
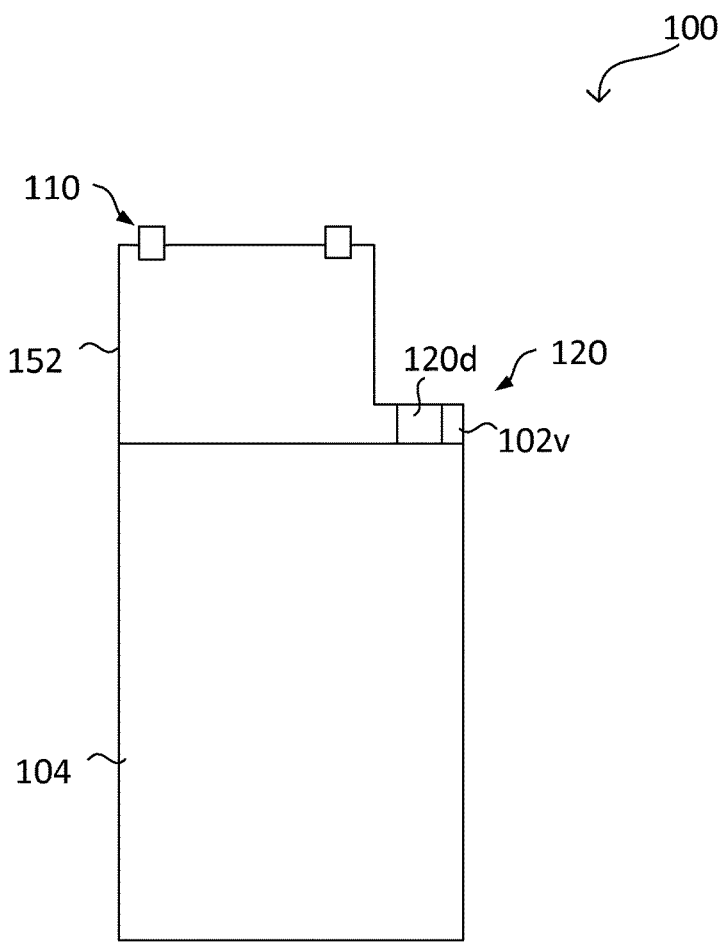

US 10,181,393 B2

END BLOCK ARRANGEMENT AND SOCKET ARRANGEMENT

CROSS-REFERENCE TO RELATED APPLICATION

This application claims priority to German Patent Application Serial No. 10 2014 115 282.4, which was filed Oct. 20, 2014, and is incorporated herein by reference in its entirety.

TECHNICAL FIELD

The invention relates to an end block arrangement and a socket arrangement.

BACKGROUND

In general, workpieces or substrates can be processed or treated, for example worked, coated, heated, etched and/or structurally modified. One method for coating a substrate is that of cathode sputtering, known as sputtering or sputter deposition. For sputtering, a plasma-forming gas (known as the working gas) can be ionized by means of a cathode and the plasma thereby formed used for atomizing material to be deposited, known as the target material. The atomized target material can then be brought to a substrate, on which it can be adsorbed and form a layer.

A modification of cathode sputtering is for example sputtering by means of a magnetron, known as magnetron sputtering. For magnetron sputtering, the forming of the plasma may be supported by means of a magnetic field, which can influence the rate of ionization of the plasma-forming gas. This may involve the formation of an intensive plasma in the form of a channel of plasma, which follows the distribution of the magnetic field. A uniform removal of target material may require that it is moved in relation to the channel of plasma, and consequently in relation to the magnetic field. For this purpose, the cathode may be of a tubular design, known as a tubular cathode, which may have a basic target tube (also known as the carrier tube), the outer lateral surface of which is at least partially covered with target material. A magnet system for generating the magnetic field may be arranged inside the basic target tube, so that when the basic target tube is rotated about the magnet system the target material arranged on the basic target tube moves under the channel of plasma and can thereby be removed and atomized layer by layer.

SUMMARY

According to various embodiments, a socket arrangement for holding an end block on a process chamber may include the following: a first socket element with a first fastening arrangement for fastening the first socket element on a process chamber wall and with a second fastening arrangement; and a second socket element with a third fastening arrangement, for fastening the second socket element on the first socket element and with a fourth fastening arrangement for fastening an end block on the second socket element; wherein the second fastening arrangement of the first socket element and the third fastening arrangement of the second socket element may be formed for engaging in one another with play in such a way that the second socket element may be deflectable in relation to the first socket element.

BRIEF DESCRIPTION OF THE DRAWINGS

Exemplary elements of the invention are explained in more detail below and are represented in the figures, in which, FIG. 1A shows a socket arrangement according to various embodiments in a schematic side view or cross-sectional view;

FIG. 1B shows an end block arrangement according to various embodiments in a schematic side view or cross-sectional view;

DESCRIPTION

Figure 2:
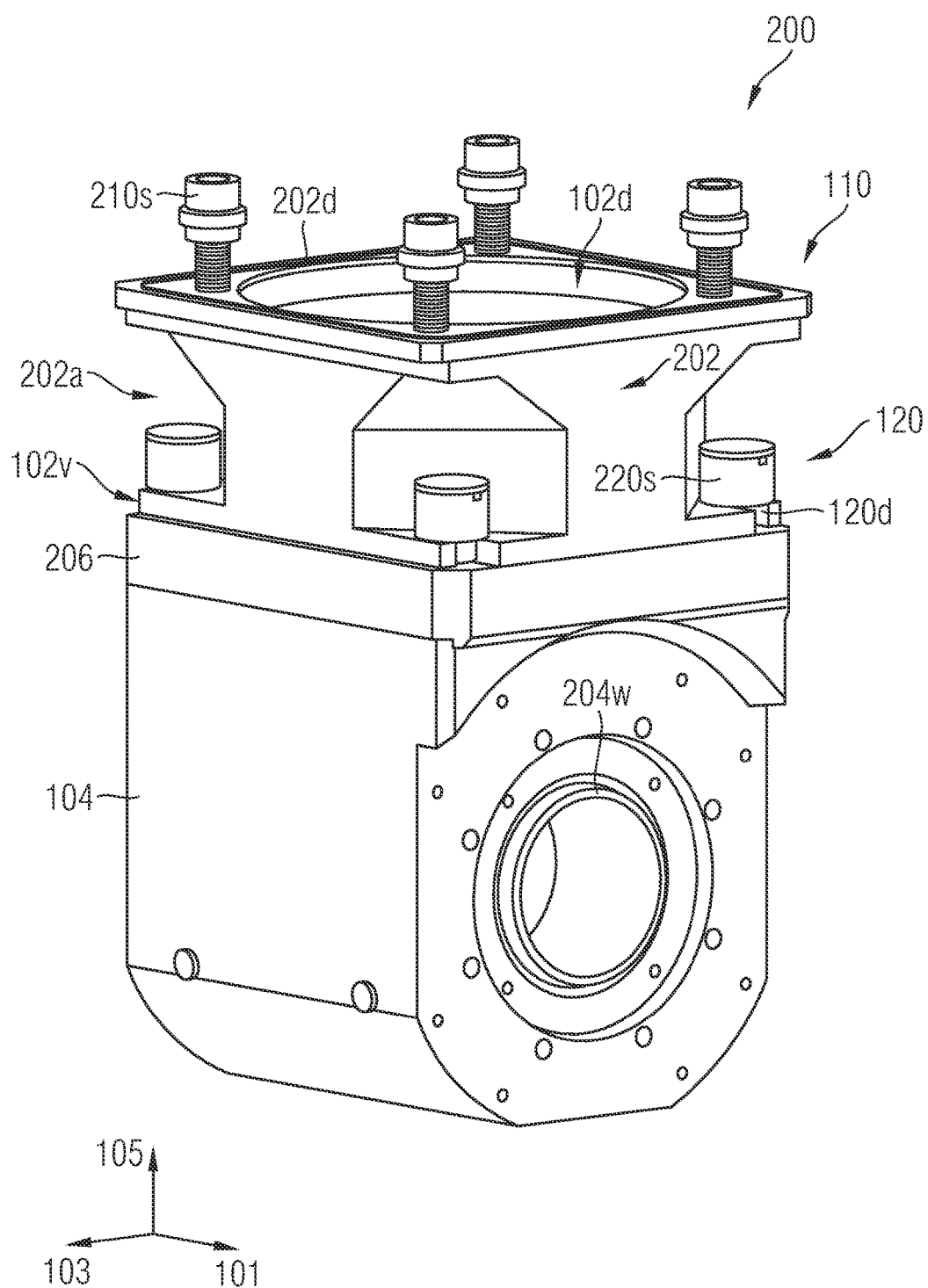
FIG. 2 shows an end block arrangement according to various embodiments in a schematic perspective view.

In the following detailed description, reference is made to the accompanying drawings, which form part of this description and in which specific embodiments in which the invention can be carried out are shown for purposes of illustration. In this respect, directional terminology such as for instance "at the top", "at the bottom", "at the front", "at the rear", "front", "rear", etc. is used with reference to the orientation of the figure(s) described. Since components of embodiments may be positioned in a number of different orientations, the directional terminology serves for purposes of illustration and is in no way restrictive. It goes without saying that other embodiments may be used and structural or logical changes made without departing from the scope of protection of the present invention. It goes without saying that the features of the various embodiments described herein by way of example can be combined with one another, unless otherwise specifically stated. The following detailed description is therefore not to be interpreted in a restrictive sense, and the scope of protection of the present invention is defined by the appended claims.

In the course of this description, the terms "connected" and "coupled" are used for describing both a direct connection and an indirect connection and both a direct coupling and an indirect coupling. In the figures, identical or similar elements are provided with identical designations, wherever appropriate.

For mounting an end block (on what is known as the process side or in the "vacuum") on a chamber wall (for example on what is known as the magnetron cover), the end block is conventionally screwed by means of four fillister head screws directly to the chamber wall (corresponding illustratively precisely to a screwing plane). If the end block has to be demounted, because of maintenance work or changing the target-substrate distance, or subsequently mounted again, these fillister head screws have to be unscrewed and subsequently screwed in again. In this case, access to the fillister head screws is on the side of the chamber wall that is facing away from the end block (on the atmosphere side), so that actuation of the fillister head screws takes place from the side of the chamber wall that is facing away from the end block. Such screwing (with precisely one screwing plane) makes handling of the end block during mounting/demounting more difficult. For example, it is difficult for a single member of the service personnel (for example a single fitter) to identify whether the end block is centered in the correct position on the chamber wall, since direct observation of the position of the end block is hindered by the chamber wall, or requires separate aids. Previously, therefore, at least one second member of the service personnel, a crane or a special mounting device has been required.

Alternatively, an adapter/flange is screwed on the chamber wall by means of fillister head screws (corresponding illustratively to a first screwing plane). The adapter is conventionally equipped with a large union nut, which makes screwing of the end block on the adapter/flange possible on the process side of the magnetron cover (corresponding illustratively to a second screwing plane). If such a union nut is to be changed or cleaned, mounting/demounting of the adapter/flange is required however, which increases the effort the maintenance involves.

Conventionally, an end block is screwed rigidly on the magnetron cover. The larger the tubular cathode (known as the target) is, the greater the weight (target load) the tubular cathode may have and the greater the load it may exert on components for the rotatable bearing of the carrier tube (rotational mounting). This produces additional mechanical loads (forces and moments) within the end block, which are induced because of high bending moments when there is a great target load. If the rotational mounting (for example rolling bearings and other adjacent components for the rotatable bearing of the carrier tube) absorbs the mechanical loading, the service life may be shortened and, as a result, the end block may prematurely lose its function. The shortening of the service life may occur in particular if the maximum bending moment occurs at the rotational mounting in the end block.

Conventionally, the bending moment (and consequently primarily the radial forces) in the rolling bearings is reduced, by an increased bearing play being set in ball bearings that are relatively close to one another, in order to make a certain axle articulation possible. Alternatively, the rolling bearings are mounted in a separate inner housing within the end block, which is supported by means of two large O-rings in the actual outer housing. Such arrangements make relatively little relief of the loading possible however, which in many applications is insufficient.

With a socket arrangement according to various embodiments, flexible/elastic fastening of the end block on the chamber wall can be made possible, so that the variation in the bending moment along the longitudinal extent of the carrier tube (in the longitudinal direction of the target) can be changed, and so that the maximum of the bending moment can be displaced out of the rotational mounting in the direction of the middle of the mounted carrier tube/shaft (in other words the target). This allows loading relief of the end block to be achieved.

According to various embodiments, components used for rotatably mounting and supplying media to a tubular cathode (for example a rotary bushing, a rolling bearing, a mechanical drive, an electrical feed and/or a seal) may be provided as what is known as an end block. Two such end blocks may hold a tubular cathode at its opposite end portions and, for processing a substrate, be mounted in a processing chamber suitable for the purpose.

An end block is conventionally screwed from outside the processing chamber to a chamber wall of the processing chamber (through the chamber wall). An exact alignment of the end block may require that the position of the end block is checked, and corrected if need be, from inside the processing chamber during the screwing. Therefore, mounting the end block has previously needed more than one person or additional aids, coordinating the screwing and alignment of the end block from opposite sides of the chamber wall.

Furthermore, an end block is conventionally screwed rigidly to a chamber wall of the processing chamber. However, the tubular cathode may be bent under its own weight and/or be unbalanced because of production inaccuracies, and thus be skewed from its rotational axis. Illustratively, the tubular cathode may be bent in the direction of gravitational force. The skewing from the rotational axis may cause a tilting moment to be transferred to the rolling bearings of the end block, which causes them to undergo additional mechanical stress. This additional mechanical stressing may shorten the service life of the rolling bearings considerably and therefore cause additional maintenance costs.

According to various embodiments, a socket arrangement that facilitates the mounting of an end block is provided. For this purpose, the socket arrangement may be fastened on the chamber wall and the end block may be fastened on the socket arrangement, so that screwing and positioning of the end block from one side of the chamber wall (on the process side) is made possible. In other words, by means of the socket arrangement a second screwing plane can be provided on the process side for fastening the end block, making it possible for the end block to be mounted on/demounted from the chamber wall. This allows costs, installation time and effort to be saved.

Furthermore, according to various embodiments, the mechanical stressing of the end block that may be produced by the weight of the tubular cathode can be reduced. For this purpose, the socket arrangement may make a tilting and/or turning of the end block in relation to the processing chamber possible, so that it can align itself with the tubular cathode and the tilting moment in the end block is reduced. In other words, the position of the rolling bearings in the end block may be adaptable to the position or form of the tubular cathode.

According to various embodiments, a socket arrangement for holding (and/or for fastening) an end block on a process chamber (also referred to as a processing chamber) may have the following: a first socket element with a first fastening arrangement for fastening the first socket element on a process chamber wall and with a second fastening arrangement; a second socket element with a first fastening arrangement for fastening the second socket element on the first socket element and with a second fastening arrangement for fastening an end block on the second socket element; wherein the second fastening arrangement of the first socket element and the first fastening arrangement of the second socket element are formed for engaging in one another with play in such a way that the second socket element is deflectable in relation to the first socket element.

According to various embodiments, the second fastening arrangement of the first socket element and the first fastening arrangement of the second socket element are designed to be releasably insertable in one another, so that the second socket element can be removed from the first socket element. This allows for example the two socket elements to be separated from one another for maintenance purposes. In other words, the socket arrangement may be of a two-part form.

According to various embodiments, the second fastening arrangement of the second socket element for fastening an end block on the second socket element (illustratively in a second fastening plane) may be formed separately from the first fastening arrangement of the first socket element (illustratively in a first fastening plane). In other words, the end block can be mounted on/demounted from the socket arrangement without the socket arrangement having to be detached from the chamber wall and/or without the socket elements having to be released from one another.

According to various embodiments, a socket arrangement may also have a sealing structure for sealing off a gap between the first socket element and the second socket element, wherein the sealing structure is arranged between portions of the first socket element and the second socket element that are adjacent one another.

A sealing structure may have at least one sealing region and a seal arranged in the sealing region, for example a vacuum seal. For fixing the seal, a sealing structure may have a depression, for example a groove or a channel, in the sealing region, wherein the seal can be arranged in the depression. The seal may be designed to prevent or at least limit a mass transfer between two spaces or volumes that are sealed off by means of the seal.

According to various embodiments, the first socket element may have a further sealing region for sealing off with respect to a process chamber wall and the second socket element may have a further sealing region for sealing off a connection to the end block. A sealing region may for example have a depression for receiving a seal or a sealing area, for example a smoothly polished surface, which for sealing-off can be pressed against a seal.

A fastening arrangement may have a connecting element, for example a bolt, a threaded pin (also known as a threaded rod), a rivet, a clamp, a threaded nut or a screw. Furthermore, a fastening arrangement may have a matching opening (or else a depression) for receiving a connecting element, for example a through-opening, a blind hole or a threaded bore.

According to various embodiments, the socket arrangement may also have a spacing element, which can be applied to the second fastening arrangement of the second socket element and defines a distance between the second socket element and an end block to be fastened on it. The spacing element may for example comprise or be formed from a metal or a metal alloy.

The spacing element may also be referred to as the target-substrate spacing element (TSS).

According to various embodiments, the spacing element may comprise a thermally and/or electrically insulating material for thermally and/or electrically insulating the second socket element from an end block to be fastened to it. The spacing element may then also be referred to as an insulating element. The spacing element may for example be coated with or formed from the thermally and/or electrically insulating material to form an insulating element. According to various embodiments, a spacing element of metal may be combined with a spacing element of a thermally and/or electrically insulating material or be coated by means of a thermally and/or electrically insulating material.

According to various embodiments, the thermally and/or electrically insulating material may have a low thermal and/or electrical conductivity (measured at room temperature), for example a thermal conductivity of less than approximately 1 W/(m·K), for example of less than approximately 0.1 W/(m·K), and/or an electrical conductivity (measured with a constant electrical field direction) of less than approximately $10^{-5}$ S/m, for example of less than approximately $10^{-7}$ S/m. For example, the thermally and/or electrically insulating material may comprise a ceramic, porcelain, glass or some other dielectric, for example an oxidic ceramic (such as alumina ($Al_2O_3$) or zirconia ($ZrO_2$)), a glass ceramic, a nitride ceramic (such as silicon nitride ($Si_3N_4$)) and/or a carbide ceramic (such as silicon carbide (SiC)), for example a sintered and/or pressed ceramic. Alternatively, the thermally and/or electrically insulating material may comprise a plastic, for example a siloxane (such as silicone) or a silicate.

According to various embodiments, the socket arrangement may also have a spring-elastic element, which is arranged between the first socket element and the second socket element, so that the second socket element is deflectable in relation to the first socket element against a restoring force. According to various embodiments, the first fastening arrangement of the first socket element may have a radially outwardly protruding projection and the second fastening arrangement of the second socket element may have a radially inwardly protruding projection, which when fitted together (in other words in an assembled state) overlap one another, wherein the spring-elastic element may be arranged between the projections.

According to various embodiments, the spring-elastic element may be understood as a structural element that yields under loading (for example is expanded or compressed) and can revert to the original shape when relieved of the load, i.e. behaves in an elastically restoring manner (reversible deformation). In other words, the spring-elastic element may be expanded/compressed up to an elasticity limit without plastically deforming or only slightly plastically deforming thereby (for example with permanent deformation of less than 0.2%) or without breaking. According to various embodiments, the spring-elastic element may behave in an elastically restoring manner up to a deformation of more than approximately 1%, for example of more than approximately 10%, for example of more than approximately 50%, for example of more than approximately 100%. The deformation may be understood as the relationship of the change in length (or change in width) to the original length (or width) of an expanded or compressed spring-elastic element. If the spring-elastic element is expanded/compressed, it can produce a restoring force that is directed counter to the expansion/compression. The restoring force (measured with constant expansion/compression) may be all the greater the harder the spring-elastic element is, i.e. the greater its spring constant is.

According to various embodiments, the spring-elastic element may comprise an elastic material, for example a plastic, such as an elastomer, a polymer or a copolymer, for example rubber, silicone, silicone rubber, fluorinated silicone rubber, natural rubber or some other suitable (for example soft and/or vacuum-compatible) plastic. For example, the polymer or the copolymer may comprise silicon.

The elasticity limit and/or the spring constant of the spring-elastic element may be influenced by the material and/or a form of the spring-elastic element. The spring constant of the spring-elastic element may be all the greater, the greater a modulus of elasticity of the elastic material is or the greater a material thickness of the elastic material is (i.e. the more solid the spring-elastic element is). The spring constant of the spring-elastic element may for example be all the greater, the greater the Shore hardness of the elastic material is. For a given spring constant, the spring-elastic element may be all the more solid (for example as a sheet or cylinder, for example as an elastomer spring), the lower the modulus of elasticity of the elastic material is.

According to various embodiments, the elastic material may be metallic, such as for example steel (for example spring steel) or some other metal, some other metal alloy or an intermetallic compound. For example, the spring-elastic element may comprise a metal spring or a plastic spring (for example in the form of a cup spring, leg spring, torsion spring, leaf spring, or some other form of spring).

According to various embodiments, one of the projections may delimit a depression (for example in the form of a groove or a mortice) in the corresponding socket element, in which the other projection (for example in the form of a tenon) can engage when the socket elements are fitted together. The projection that delimits the depression may also be referred to as a wall portion of the depression. The fastening arrangements (for example the projection and/or the depression) may for example run around a portion of one of the socket elements.

According to various embodiments, a socket arrangement may also have a connecting element, which penetrates the second fastening arrangement of the first socket element and the first fastening arrangement of the second socket element. For example, the connecting element may penetrate the projections.

According to various embodiments, the second fastening arrangement of the first socket element and/or the first fastening arrangement of the second socket element may have an opening, into which the spring-elastic element protrudes and forms (for example in it) a connecting element (for example a screwing portion) for connecting the spring-elastic element to another connecting element (for example to the connecting element penetrating the projections). The spring-elastic element may for example be designed in such a way that a screw can be screwed in it, i.e. the spring-elastic element may act as a connecting element. For example, the screwing portion may be formed by means of an opening with an internal thread in the spring-elastic element. The spring-elastic element may be formed for example as a blind rivet nut (also referred to as a threaded hollow rivet or a riveting nut).

According to various embodiments, the second fastening arrangement of the first socket element and the first fastening arrangement of the second socket element may surround a through-opening penetrating the socket arrangement for receiving a supplying arrangement. The through-opening may also be referred to as a supplying opening.

According to various embodiments, a supplying arrangement may be received in the through-opening. A supplying arrangement may comprise for example a pipeline for transporting a cooling fluid to the end block, a traction drive for transferring mechanical force to the end block, a shaft for transferring mechanical force to the end block or an electrical line for transferring electrical energy to the end block. The supplying arrangement may for example be fastened on the end block.

According to various embodiments, an end block arrangement may have the following: an end block for rotatably mounting a tubular cathode and a socket arrangement for fastening the end block. According to various embodiments, the end block may be fastened on the socket arrangement. According to various embodiments, the socket arrangement may be fastened on a chamber wall.

According to various embodiments, the first fastening arrangement of the first socket element may have a blind hole with a thread, which extends into the socket arrangement.

Illustratively, the second fastening arrangement of the first socket element and the first fastening arrangement of the second socket element may be part of a coupling structure, which couples the first socket element and the second socket element to one another movably with respect to one another. The coupling structure may illustratively also act as a joint between the first socket element and the second socket element. For producing a restoring force when deflecting the second socket element with respect to the first socket element, the coupling structure may for example have a spring-elastic element.

When there are vibrations (repeated deflections) of one of the socket elements or when there are shocks (in other words forces acting in the form of pulses) on/against one of the socket elements, the coupling structure may have a damping effect. In other words, the first socket element and the second socket element may be coupled to one another in a vibrationally damped manner by means of the coupling structure.

The coupling structure may have a connecting element of the elastic material, for example in the form of a nut or a blind rivet nut. For connecting the two socket elements to one another, another connecting element of the coupling structure, for example a screw, rivet or threaded pin, may be received in the elastic material, for example screwed in.

The connecting elements of the coupling structure may be arranged in matching openings or depressions of the second fastening arrangement of the first socket element and/or of the first fastening arrangement of the second socket element. According to various embodiments, the coupling structure may for example have a screwed connection or riveted connection, which connects the fastening arrangements to one another. The openings or depressions in the fastening arrangements may be designed and arranged in such a way that they are in line with one another in a state of the two socket elements inserted one into the other.

The coupling structure may make a positive connection of the two socket elements to one another possible. For example by the spring-elastic element being arranged between the two fastening arrangements and/or by the two socket elements being connected to one another by means of a connecting element of the coupling structure.

The socket arrangement, or a socket element of the socket arrangement, may comprise a metal or metal alloy, for example aluminum, iron, an aluminum alloy or an iron alloy (for example steel).

According to various embodiments, a socket arrangement for holding an end block may have the following: a first socket element for fastening the socket arrangement on a processing chamber; and a second socket element for fastening the socket arrangement on an end block; wherein one of the socket elements can protrude with a first portion into a second portion of the other of the socket elements; wherein the first portion and the second portion can engage in one another in such a way that the first socket element and the second socket element are coupled (or connected) to one another in such a way as to allow them to be deflected with respect to one another; and a sealing structure, which runs around the first portion and seals off a gap between the first portion and the second portion.

According to various embodiments, an end block arrangement may have the following: at least one end block for rotatably mounting a tubular cathode; a socket arrangement for holding the end block; wherein the socket arrangement may have a first fastening arrangement for connecting the socket arrangement to a wall element (for example a chamber wall); and wherein the socket arrangement may have opposite from the first fastening arrangement a second fastening arrangement for connecting the socket arrangement to the end block, wherein the second fastening arrangement may have a through-opening, which penetrates a projection of the socket arrangement. According to various embodiments, such a socket arrangement may be formed in one piece. A socket arrangement formed in one piece may be used for example when the mechanical loads on the end block are tolerable and it is only intended to facilitate the installation of the end block. For example, the socket arrangement formed as one part (or in one piece) may hold one end block of the pair of end blocks and be combined with a socket arrangement formed as two parts (with a coupling structure), which can hold the other end block of the pair of end blocks.

According to various embodiments, by means of an end block a tubular cathode can be supplied with electrical energy, with a coolant (for example a cooling fluid) and/or with mechanical energy for rotating the tubular cathode. These can be fed to the end block from outside the vacuum chamber through a chamber wall of the vacuum chamber by means of the supplying arrangement.

The end block may also be designed in such a way that the tubular cathode can be exchanged, for example after the target material has been used up. For this purpose, the end block may for example have a holder (for example a flange or a coupling), so that the tubular cathode can be fastened on the end block. Furthermore, the tubular cathode may be mounted at one end portion or at each of both (axial) end portions by means of an end block (forming a pair of end blocks). Each end block of the pair of end blocks may be part of an end block arrangement, such as that described herein. Furthermore, the driving components (for example the motor, transmission and/or belt) of the supplying structure may be arranged in an end block of the pair of end blocks (what is known as the driving end block) and the supplying components (for example the electrical feed and/or the coolant feed) of the supplying structure may be arranged in the other end block of the pair of end blocks (known as the media end block).

The end block arrangement and the tubular cathode may be part of a magnetron (known as a tubular magnetron), with which the sputtering can be performed. For the sputtering, the end block arrangement may be arranged within a processing chamber and be fastened on a chamber wall of the processing chamber. The magnetron and the processing chamber may be part of a processing arrangement. The processing arrangement may also have a transporting system for transporting the substrate to be coated in the processing chamber.

Furthermore, the sputtering may be performed in a vacuum. For this purpose, the processing chamber may be designed as a vacuum chamber and be coupled with a pump system, so that a vacuum and/or a negative pressure can be provided within the processing chamber. Furthermore, the processing chamber may be designed in such a way that the ambient conditions (the process conditions) within the processing chamber (for example the pressure, temperature, gas composition, etc.) can be set or controlled during the sputtering. For this purpose, the processing chamber may be designed for example as air-tight, dust-tight and/or vacuum-tight. For example, the processing chamber may be fed an ion-forming gas (process gas) or a gas mixture (for example of a process gas and a reactive gas) by means of a gas feed to form a process atmosphere in the processing chamber. In the case of reactive magnetron sputtering, the atomized target material may be reacted with the reactive gas and the reaction product deposited. An end block arrangement, such as that described herein, may be used for example for vacuum coating installations with tubular magnetrons.

According to various embodiments, a magnetron arrangement for sputtering may have a first end block, such as that described herein, and a second end block, such as that described herein. The first end block and the second end block may form a pair of end blocks for rotatably mounting and supplying media to a tubular cathode. According to various embodiments, at least one of the end blocks of the pair of end blocks may be mounted by means of a socket arrangement, such as that described herein. According to various embodiments, the magnetron arrangement may have a tubular cathode rotatably mounted by means of the pair of end blocks. According to various embodiments, one end block of the pair of end blocks may be formed as a driving end block and the other end block of the pair of end blocks may be formed as a media end block.

Alternatively, one end block may be designed for driving and supplying a medium to the tubular cathode. Then, the end portion of the tubular cathode that is opposite from the end block may be supported and rotatably mounted by means of a bearing block. In other words, the bearing block may form in relation to the end block a counter bearing on which an end portion of the tubular cathode can be supported.

According to various embodiments, a magnetron arrangement may have the following: a process chamber wall; one end block and another end block (or alternatively a bearing block), which are together designed for rotatably mounting and supplying media to a tubular cathode; a socket arrangement on which the end block is fastened; wherein the process chamber wall has a first fastening arrangement for fastening the socket arrangement on the process chamber wall and a second fastening arrangement for fastening the other end block (or alternatively the bearing block) on the process chamber wall; wherein a relative position of the end block in relation to the other end block (or alternatively the bearing block) is defined by means of the first fastening arrangement and the second fastening arrangement; and wherein the socket arrangement is designed for deflecting the end block along at least two degrees of freedom in relation to the process chamber wall.

Figure 3:
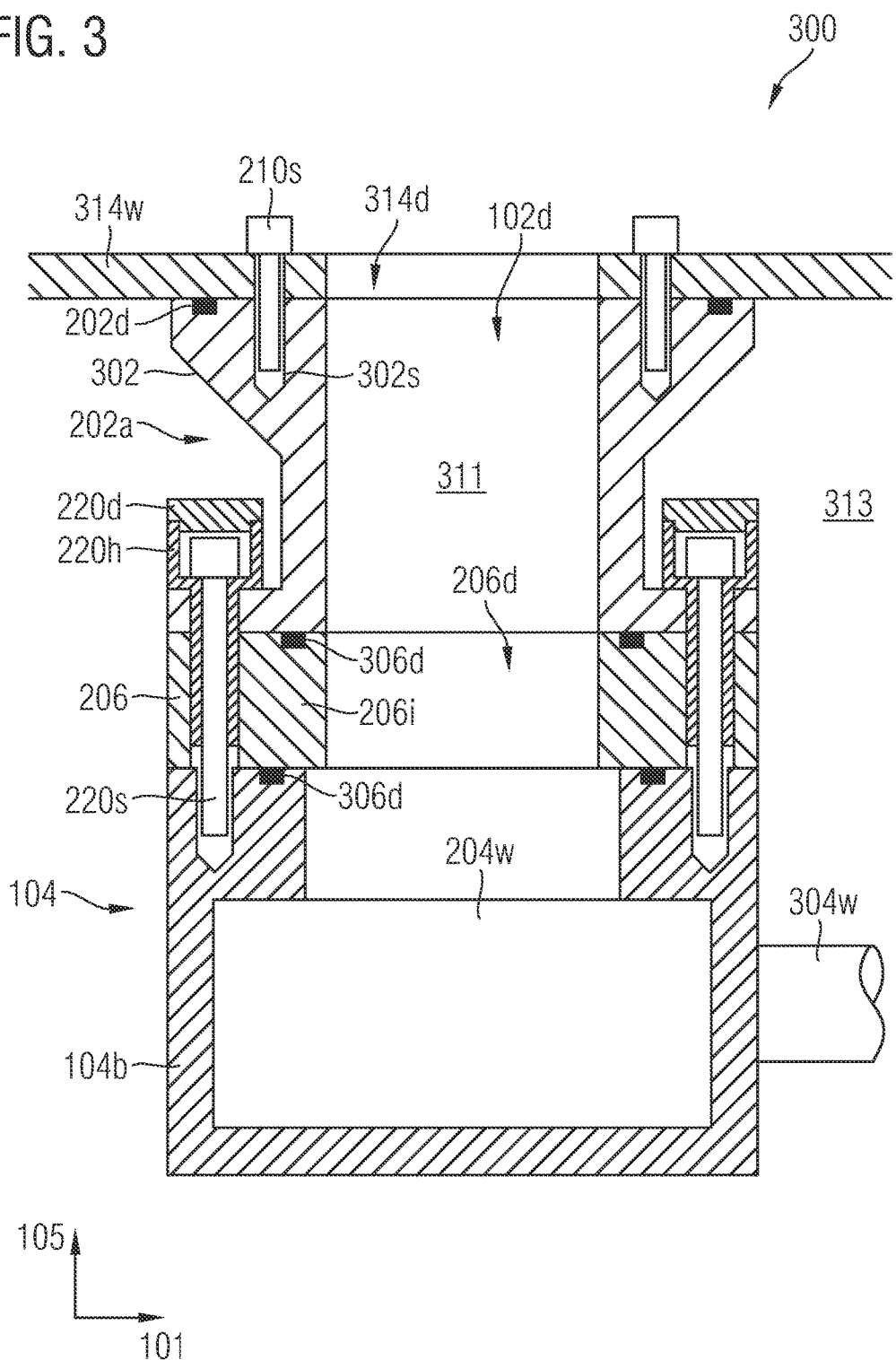
FIG. 3 shows an end block arrangement according to various embodiments in a schematic side view or cross-sectional view.

FIG. 1A illustrates a socket arrangement 102 according to various embodiments in a schematic side view or cross-sectional view (for example transversely in relation to a mounting plane or process chamber wall 314w, see FIG. 3).

The socket arrangement 102 may have a first socket element 312, which may have a first fastening arrangement 110 for fastening the first socket element 312 on a process chamber wall (chamber wall) and a second fastening arrangement 102a. Furthermore, the socket arrangement 102 may have a second socket element 322, which may have a first fastening arrangement 102b for fastening the second socket element 322 on the first socket element 312 and a second fastening arrangement 120 for fastening an end block on the second socket element 322.

The second fastening arrangement 102a of the first socket element 312 and the first fastening arrangement 102b of the second socket element 322 may be designed for engaging in one another with play in such a way that the second socket element 322 is deflectable in relation to the first socket element 312. For this purpose, a gap 102s, which makes the play possible, may be made to extend between the second socket element 322 and the first socket element 312.

FIG. 1B illustrates an end block arrangement 100 according to various embodiments in a schematic side view or cross-sectional view (analogous to FIG. 1A). The end block arrangement 100 may have at least one end block 104 for rotatably mounting a tubular cathode 304w (not represented in FIG. 1, see FIG. 3). Furthermore, the end block arrangement 100 may have a socket arrangement 152 for holding the end block 104.

The socket arrangement 152 may have a first fastening arrangement 110 (also referred to as the first screwing plane 110) for connecting the socket arrangement 152 to a wall element (for example a chamber wall). For example, the first fastening arrangement 110 may have (one or) a number of blind holes with an internal thread in which a screw can be screwed. Alternatively, the first fastening arrangement 110 may have bolts or threaded pins, which extend away from the socket arrangement 152.

Furthermore, the socket arrangement 102 may have opposite from the first fastening arrangement 110 a second fastening arrangement 120 for connecting the socket arrangement 152 to the end block 104. The second fastening arrangement 120 may have a through-opening 120d, which can penetrate a projection 102v of the socket arrangement 152. A connecting element (for example a screw), which may be connected to the end block 104, may be inserted in the through-opening 120d.

FIG. 2 illustrates an end block arrangement 200 with a socket arrangement 202 according to various embodiments in a schematic perspective view, wherein a spacing element 206 may be arranged between the socket arrangement 202 (also referred to as a fastening flange 202) and the end block 104. By means of the spacing element 206, a distance between the socket arrangement 202 and the end block 104 can be increased. This may be required if for example the distance of the tubular cathode from a substrate to be coated (known as the target-substrate distance) is to be adapted (for example is to be reduced). For example a number of spacing elements 206 may be combined with one another, for example spacing elements 206 with different thicknesses may be used, to adapt the target-substrate distance.

The target-substrate distance may also be set by means of spacing elements 206 of different heights. There may therefore be a number of possibilities of combinations for setting a target-substrate distance, for example with just one spacing element 206 that is adapted to the required target-substrate distance, with a number of spacing elements 206 or with at least one insulating element 206 and at least one spacing element 206.

The first fastening arrangement 110 may also have a number of first connecting elements 210s, for example screws 210s or fillister head screws 210s, as represented in FIG. 2, and threaded bores matching them in the socket arrangement 202, in which the screws 210s can be screwed for fastening the socket arrangement 202 on a chamber wall 314w or a chamber cover 314w designed to match it (not represented in FIG. 2, see for example FIG. 3).

According to various embodiments, the socket arrangement 202 may be designed to match a chamber wall 314w or chamber cover 314w and have on a first side (also referred to as the cover connection) a sealing structure 202d with a seal, for example a vacuum seal. The sealing structure 202d may surround the first fastening arrangement 110. Furthermore, the socket arrangement 202 may be designed to match an end block 104 and have on a second side (also referred to as the intermediate adapter) a sealing area or a sealing structure (concealed in this view, see FIG. 3), in which a seal may be arranged.

Furthermore, the socket arrangement 202 may have a number of recesses 202a (for example in the form of pockets). The number of recesses 202a may be arranged for example respectively at the corners, for example at opposite regions, of the socket arrangement 202, wherein each recess of the number of recesses 202a can respectively define a projection 102v of the socket arrangement 202. In other words, the number of recesses 202a can define a number of projections 102v.

The second fastening arrangement 120 (also referred to as the second screwing plane 120) may have a number of through-openings 120d, wherein each through-opening of the number of through-openings 120d can penetrate a projection of the number of projections 102v. Furthermore, the second fastening arrangement 120 may have a number of second connecting elements 220s, for example screws 220s or fillister head screws, as is represented in FIG. 2. In a recess 202a there may be respectively arranged a screw 220s, which can extend through a through-opening of the number of through-openings 120d.

A screw 220s of the second fastening arrangement 120 may also be made to extend through a matching through-opening in the spacing element 206 and into the end block 104, for example be screwed into the end block 104. The screws 220s arranged in the recesses 202a may make it possible for the end block 104 to be fastened on the socket arrangement 202 (on the process side or else on the vacuum side). This makes it possible for a positive connection to be achieved between the socket arrangement 202, the end block 104 and the spacing element 206.

Alternatively, the second connecting elements 220s may also have a threaded pin, fastened on the end block 104, and a nut, screwed onto the threaded pin, or the positive connection may take place in some other way. The use of standard parts, such as fillister head screws 210s, as connecting elements of the end block arrangement 200 makes it possible for example for the end block arrangement 200 to be produced at low cost.

If the second fastening arrangement 120 has second connecting elements 220s, the length of which exceeds the extent of the recesses 202a, the through-openings 120d may be of a laterally open form according to various embodiments. This allows the effect to be achieved that a connecting element 220s can be brought into the through-opening 120d from a lateral direction.

On and/or in the end block 104 there may be arranged a shaft 204w (for example a hollow shaft 204w), known as a bearing shaft 204w, wherein the bearing shaft 204w may for example extend along the direction 101. The bearing shaft 204w may be rotatably mounted or rotatably supported in the end block 104 (for example rotatable about an axis of rotation along the direction 101). On the bearing shaft 204w there may be fastened a basic target tube (not represented in FIG. 2, see FIG. 3) for carrying out a sputtering process, for example as part of a tubular cathode. For example, the basic target tube may be fitted onto the bearing shaft 204w or inserted into the bearing shaft 204w and/or alternatively fastened on the bearing shaft 204w in some other way by means of a target fastening (for example a flange and/or a clamp).

According to various embodiments, the socket arrangement 202 may have an opening 102d (supplying opening 102d), which makes it possible to supply media to the end block 104 through the socket arrangement 202, for example to make electrical contact for supplying electrical energy to it.

FIG. 3 illustrates an end block arrangement 300 according to various embodiments in a schematic cross-sectional view (analogous to FIG. 1A, for example parallel to the axis of rotation of the bearing shaft 204w) with a socket arrangement 302, wherein the socket arrangement 302 can be fastened on a chamber wall 314w of a processing chamber. The socket arrangement 302 may be fastened on the chamber wall 314w by means of screws 210s. The screws 210s for fastening the socket arrangement 302 may be screwed into the socket arrangement 302 from a side of the chamber wall 314w that is facing away from the socket arrangement 302 (in other words be actuated on the atmosphere side).

The end block arrangement 300 may have an end block 104, which may be mounted by means of the socket arrangement 302 on the chamber wall 314w (also referred to as the housing wall 314w). The chamber wall 314w may be part of a chamber housing or of a chamber cover of the processing chamber. Illustratively, the side of the chamber wall 314w that is facing the end block 104 (in the mounted state) (also known as the process side or the vacuum side) may be located inside the processing chamber during a sputtering process and the side of the chamber wall 314w (chamber cover) that is facing away from the end block 104 (also known as the atmosphere side) may be located outside the processing chamber during a sputtering process.

If the chamber wall 314w is part of a chamber cover, the processing chamber may have a chamber housing with a chamber opening for receiving the chamber cover. The chamber cover may close the chamber opening in a vacuum-tight manner when the chamber cover has been received in the chamber opening, so that the processing chamber can be evacuated by a pump to form a vacuum 313 or a process atmosphere within the processing chamber. A vacuum 313 or a process atmosphere 313 with a pressure of less than 1 mbar, for example of less than $10^{-2}$ mbar, for example of less than $10^{-4}$ mbar, for example of less than $10^{-6}$ mbar, may be produced for example within the processing chamber.

Once the chamber housing has been closed by means of the chamber cover, the socket arrangement 302 can extend into the interior of the chamber housing. For opening the chamber housing, the chamber cover may be designed in such a way that it can be removed from the processing chamber or pivoted. The opening of the chamber housing may for example facilitate access to the interior of the processing chamber, for example for maintenance work. Mounting/demounting of the socket arrangement 302, the end block 104 and/or the tubular cathode 304w can be performed for example with the chamber cover removed.

The socket arrangement 302 may be part of a magnetron (or a magnetron arrangement), by means of which a substrate can be processed, for example coated. The chamber cover may then also be referred to as a magnetron cover. The magnetron may also have the end block 104 and a tubular cathode 304w, which may be coupled to the bearing shaft 204w of the end block 104. The tubular cathode 304w, or the carrier tube, may be made to extend longitudinally along the axis of rotation of the bearing shaft (along direction 101).

For operating the magnetron, it may be necessary to supply media to the tubular cathode 304w, for example electrical energy, cooling fluid or mechanical energy (for rotating the tubular cathode 304w), from outside the processing chamber through the chamber wall 314w. For this purpose, the chamber wall 314w (or by analogy the chamber cover) may have a through-opening 314d, through which the end block 104, or the tubular cathode 304w, can be supplied with media.

Furthermore, the socket arrangement 302 may be penetrated by a matching through-opening 102d (supplying opening 102d) and the spacing element 206 may be penetrated by a matching through-opening 206d, which connect the end block 104 to the through-opening 314d in the chamber wall 314w. The through-opening 102d in the socket arrangement 302 may extend from the first side of the socket arrangement 302 to the second side of the socket arrangement 302, which is opposite from the first side.

According to various embodiments, the end block 104 may have a basic housing 104b. The basic housing 104b of the end block 104 may for example at least partially surround and/or support the components for rotatably mounting the tubular cathode 304w (the bearing shaft 204w, rotary bushing, rolling bearings and/or seals) and the supplying arrangement 1102 (not represented in FIG. 3, compare FIG. 11 or FIG. 12).

The through-opening 102d of the socket arrangement 302, the through-opening 206d of the spacing element 206 and the interior of the end block 104 may form an interior of the end block arrangement 300, wherein the interior of the end block arrangement 300 may be connected to the exterior of the processing chamber (also known as the atmosphere side) through the through-opening 314d in the chamber wall 314w.

Once a process atmosphere 313 (for example a vacuum) has formed within the processing chamber, the interior of the end block arrangement 300 may be at a pressure that is greater than the pressure of the process atmosphere 313. For example, the interior of the end block arrangement 300 may be at approximately atmospheric pressure 311 (approximately 100 kPa). For this purpose, the interior of the end block arrangement 300 may be sealed off with respect to the interior of the processing chamber (and consequently with respect to the process atmosphere 313) by means of corresponding sealing structures 202d, 306d.

For sealing off the interior of the end block arrangement 300 with respect to the interior of the processing chamber, between the chamber wall 314w and the socket arrangement 302, between the socket arrangement 302 and the spacing element 206 and between the spacing element 206 and the end block 104 there may be respectively arranged a sealing structure 202d, 306d, which makes sealing off of a gap between the adjacent components possible. The sealing structures 202d, 306d may respectively have a vacuum seal (for example a rubber seal), for example an O-ring, a flat gasket, a profile seal or a seal with some other geometry.

For operating the tubular cathode 304w, it may be at an electrical potential (illustratively, if it is electrically supplied). The electrical potential may also be transferred to the end block 104. Therefore, it may be necessary to insulate the end block 104 electrically from the processing chamber, or the chamber wall 314w, (for example to ensure safety at work). Furthermore, the end block 104 may be heated during the operation of the tubular cathode 304w. Therefore, it may be necessary to insulate the end block 104 thermally from the processing chamber, or the chamber wall 314w. For the thermal and/or electrical insulation of the end block 104 from the processing chamber (or the socket arrangement 302), the spacing element 206 may according to various embodiments consist of a thermally and/or electrically insulating material 206*i* to form an insulating element 206.

Conventionally, the insulating element 206 may be formed from silicone, which makes a certain compliance of the insulating element 206 possible. In this case, however, flashovers may occur, since the insulating ability of the insulating element 206 is impaired if it yields. A stiffening or limiting of the compliance of the insulating element 206 can be increased by means of ceramic beads embedded (as spacers) in the silicone.

As described above, the end block 104 may be connected to the socket arrangement 302 by means of the screws 220*s* through the spacing element 206. For thermally and/or electrically insulating the screws 220*s* from the socket arrangement 302, the second fastening arrangement 120 of the second socket element 322 may have thermally and/or electrically insulating sleeves 220*h* (for example in the form of bushes), which extend between the screws 220*s* and the socket arrangement 302. The sleeves 220*h* may consist of a thermally and/or electrically insulating material 206*i*.

The sleeves 220*h* may be inserted in the through-openings 120*d* of the second fastening arrangement 120 and extend at least partially into the spacing element 206. For this purpose, the through-openings 120*d* of the second fastening arrangement 120 may be dimensioned to be appropriately large. Furthermore, the screws 220*s* may be received in the sleeves 220*h* and extend through the sleeves 220*h*.

The sleeves 220*h* may be covered with plugs 220*d* (in the form of covers) to prevent coating of the screws 220*s*. In this way it can be prevented that atomized target material is adsorbed on the screws 220*s* and can form on the screws 220*s* a layer (vapor-deposited layer) that connects the screws 220*s* to the socket arrangement 302 with an electrically conducting effect or impairs the electrical insulation between the end block 104 and the socket arrangement 302.

Figure 4A:
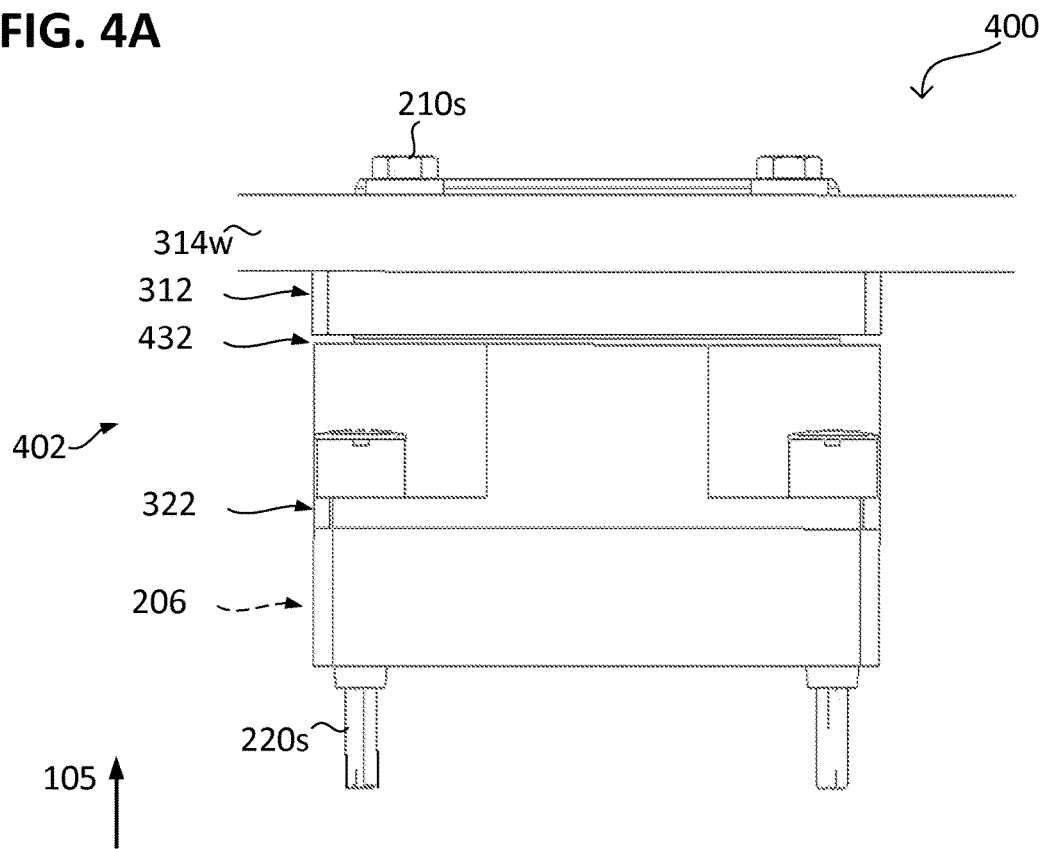
FIG. 4A and FIG. 4B respectively show an end block arrangement according to various embodiments in a schematic side view or cross-sectional view.

FIG. 4A illustrates an end block arrangement 400 with a socket arrangement 402 according to various embodiments in a schematic side view or cross-sectional view (analogous to FIG. 1A), wherein the socket arrangement 402 may have two socket elements 312, 322. In other words, the socket arrangement 402 may be formed as two parts.

The first socket element 312 (also referred to as the cover connection 312) may have a first fastening arrangement 110, as described above. For example, the cover connection 312 may have one or more blind holes, in which corresponding screws 210*s* are screwed. According to various embodiments, the cover connection 312 may be rigidly screwed to the chamber wall 314*w* (for example a magnetron cover). The second socket element (also referred to as the intermediate adapter 322) may have a second fastening arrangement 120, as described above. For example, the intermediate adapter 322 may have one or more through-openings 120*d*, in which corresponding screws 220*s* are arranged. Alternatively, the intermediate adapter 322 may also be fastened on the end block 104 by means of other connecting elements.

Furthermore, the socket arrangement 402 may have a coupling structure 432 for coupling the cover connection 312 to the intermediate adapter 322. The coupling structure 432 may be designed in such a way that the cover connection 312 and the intermediate adapter 322 are coupled (or connected) to one another in such a way as to allow them to be moved with respect to one another. For example, the coupling structure 432 may have a spring-elastic element, for example a rubber plate, which is made to extend between the first socket element 312 and the second socket element 322.

According to various embodiments, the end block arrangement 400 may be formed with or without a spacing element 206 (indicated by dashed lines). In other words, depending on the need, a spacing element 206 may be additionally used or an end block fastened directly on the second socket element 322. According to various embodiments, the spacing element 206 may be part of the second socket element 322. In other words, the spacing element 206 and the second socket element 322 may be formed in one piece.

Figure 4B:
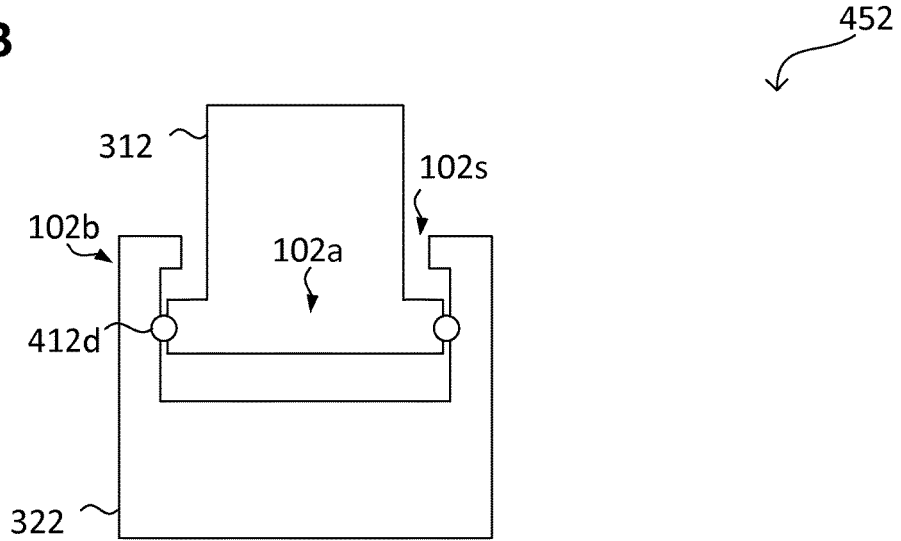

FIG. 4B illustrates a socket arrangement 452 according to various embodiments in a schematic side view or cross-sectional view (analogous to FIG. 1A).

The first socket element 312 may protrude with a first portion into a second portion of the second socket element 322, for example into a recess in the second portion. The first portion may be part of the second fastening arrangement 102*a* of the first socket element 312. The second portion may be part of the first fastening arrangement 102*b* of the second socket element 322.

The fastening arrangements 102*a*, 102*b* may be designed in such a way that the second socket element 322 is deflectable in relation to the first socket element 312 along a number of degrees of freedom, for example along one, two or three translational degrees of freedom and one rotational degree of freedom, along one, two or three translational degrees of freedom and two rotational degrees of freedom, along one, two or three translational degrees of freedom and three rotational degrees of freedom, along two or three translational degrees of freedom or along two or three rotational degrees of freedom. During the sputtering, for example when the end block 104 is fastened on the second socket element 322, the interengaging fastening arrangements 102*a*, 102*b* may prevent the first portion from being detached from the second portion.

A rotational degree of freedom (also referred to as a degree of rotational freedom) may be understood as rotation about an axis. A translational degree of freedom (also referred to as a degree of translational freedom) may be understood as movement along a direction. The number of degrees of freedom may be understood as the number of possibilities of movement that are independent of one another, for example as the number of directions running transversely in relation to one another and/or as the number of axes running transversely in relation to one another, along/about which a system can move, or along/about which the second socket element 322 can be deflected.

Furthermore, the socket arrangement 452 may have a sealing structure 412*d*, which runs around the first portion. The sealing structure 412*d* may for example have a sealing region and a seal that is arranged in the sealing region. Furthermore, the sealing structure 412*d* may be designed in such a way that it seals off a gap 102*s* between the first portion and the second portion. For example, the sealing structure 412*d* may seal off, for example in a vacuum-type manner, a cavity in the socket arrangement 452 with respect to an exterior surrounding the socket arrangement 452.

Figure 5:
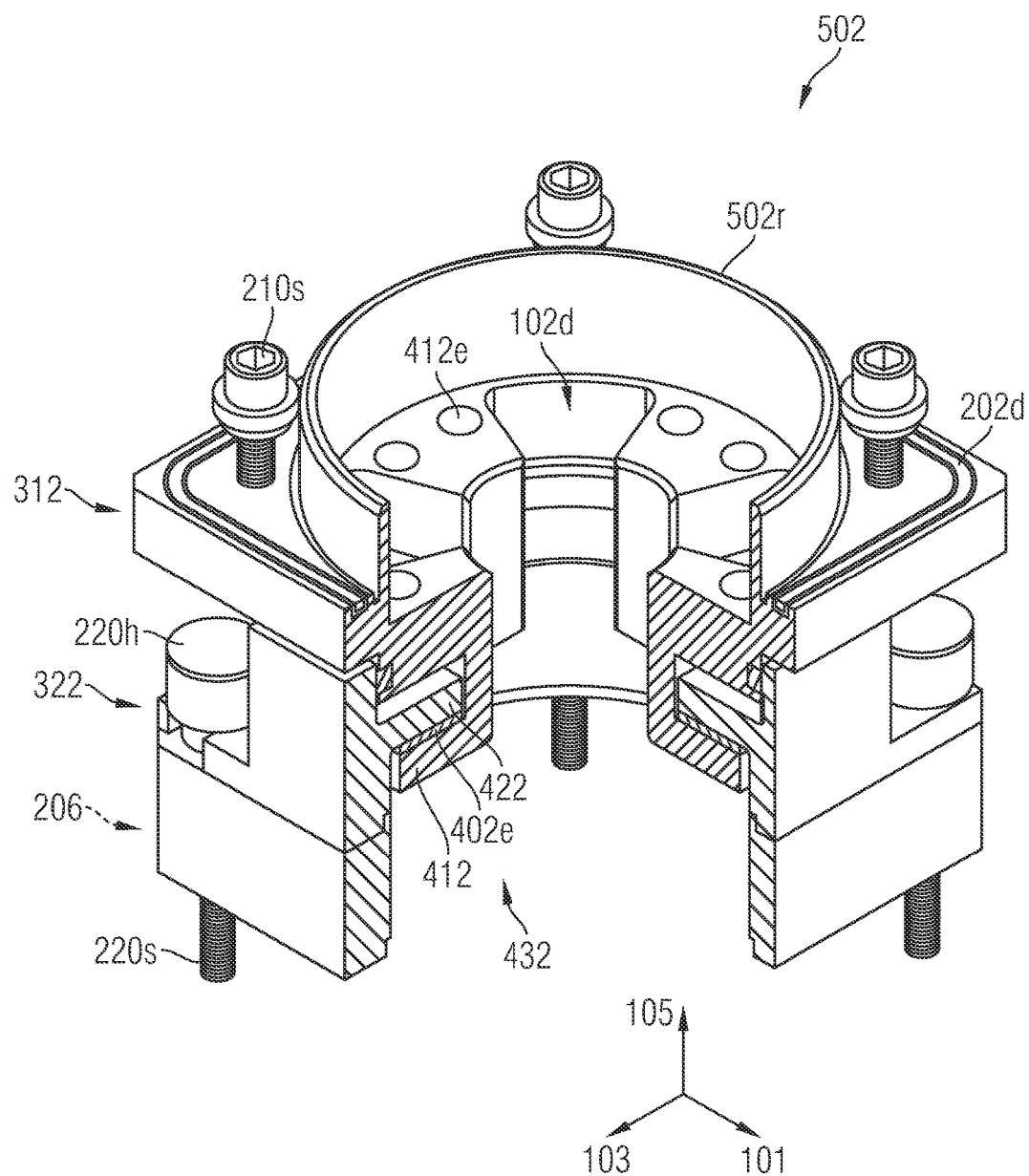
FIG. 5 shows a socket arrangement according to various embodiments in a schematic perspective view.

FIG. 5 illustrates a socket arrangement 502 according to various embodiments in a schematic perspective view, wherein the socket arrangement 502 may have two socket elements 312, 322 which at least partially engage in one another and are spring-elastically coupled to one another.

For this purpose, the cover connection 312 may have an insertion portion in the form of a peripheral groove 412, which may be part of the second fastening arrangement 102*a* of the cover connection 312. Furthermore, the intermediate adapter 322 may have an insertion portion in the form of a projection 422, which may be part of the first fastening arrangement 102b of the intermediate adapter 322. The groove 412 may be delimited on two opposite sides by in each case a wall portion (or a projection). The insertion portions may be designed in such a way that they can be inserted one into the other to connect the cover connection 312 to the intermediate adapter 322. For example, the insertion portions may be designed in such a way that the projection 422 can be brought (for example fitted) into the groove 412 by a turning movement.

For example, a wall portion of the groove 412 may have one or more cutouts (for example on the side of the groove that is facing away from the chamber wall), in which the insertion portion 422 of the second socket element 322 can be inserted, for example by means of an upward movement of the second socket element 322 in relation to the first socket element 312. Furthermore, this insertion portion may be inserted (brought) into the groove 412 by means of a turning movement of the second socket element 322 in relation to the first socket element 312, so that a holding connection can be produced between the first socket element 312 and the second socket element 322. When fitted one into the other, the insertion portions 412, 422 may be at a distance from one another, so that between the insertion portions 412, 422 there extends a gap, which makes it possible for the two socket elements 312, 322 to move in relation to one another.

Between the projection 422 and one of the wall portions of the groove 412 there may be arranged a spring-elastic element (for example in the gap), for example in the form of an elastic plate 402e (for example a rubber plate or some other spring-elastic plate). The elastic plate 402e may for example at least partially fill the gap between the projection 422 and one of the wall portions of the groove 412. The insertion portions (projection 422 and groove 412) and the elastic plate 402e may be part of the coupling structure 432 of the socket arrangement 502.

A wall portion of the groove 412 may be penetrated by a through-opening 412e, which may make it possible for example to bring a connecting element into the groove 412, for example a screw or a threaded pin. Furthermore, the through-opening 412e may make it possible to actuate the connecting element, for example to turn or lock it, for example to screw it in or unscrew it.

Furthermore, the socket arrangement 502 may have a tube portion 512r (or a tube attachment), which can be inserted into the through-opening 314d in the chamber wall 314w.

Figure 6:
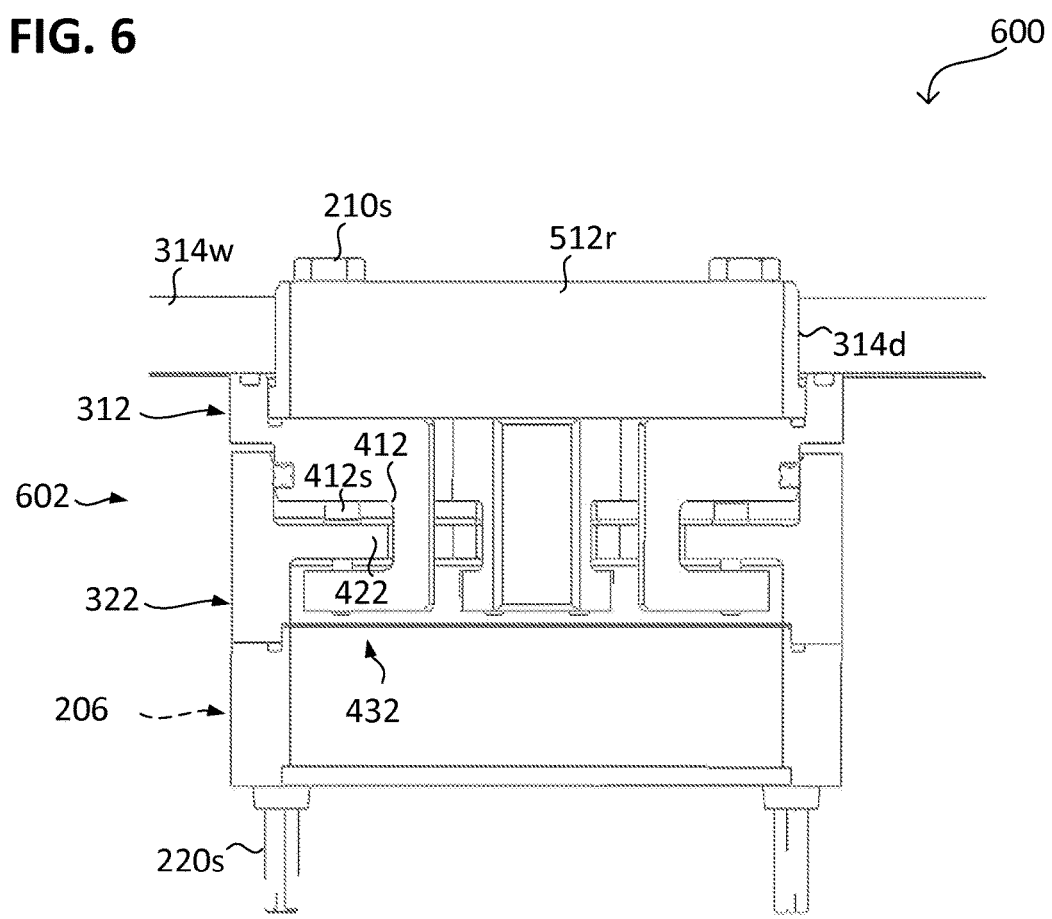
FIG. 6 shows an end block arrangement according to various embodiments in a schematic side view or cross-sectional view.

FIG. 6 illustrates an end block arrangement 600 with a socket arrangement 602 according to various embodiments in a schematic side view or cross-sectional view (analogous to FIG. 1A), wherein the socket arrangement 602 is shown mounted on a chamber wall 314w. The tube portion 512r (or tube attachment) of the socket arrangement 602 may be designed in such a way that it is received in the through-opening 314d of the chamber wall 314w in a positively engaging manner when the socket arrangement 602 is mounted on the chamber wall 314w. This can achieve the effect that the position of the socket arrangement 602 in relation to the chamber wall 314w is defined by the through-opening 314d in the chamber wall 314w, so that it is possible to dispense with aligning and/or positioning the socket arrangement 602.

Furthermore, the projection 422 of the intermediate adapter 322 may be penetrated by a through-opening, into which a connecting element may be introduced, for example a screw 412s, as represented in FIG. 6. The screw 412s may be screwed in a matching threaded bore in a wall portion of the groove 412. By means of the screw 412s, the cover connection 312 and the intermediate adapter 322 can be secured against turning in relation to one another. This allows the effect to be achieved that, when inserted one into the other, the cover connection 312 and the intermediate adapter 322 are positively connected to one another and detachment of the cover connection 312 from the intermediate adapter 322 can be avoided.

In a state of the cover connection 312 and the intermediate adapter 322 in which they are inserted one into the other, the through-openings/threaded bores in the wall portions of the groove 412 and the through-opening in the projection 422 can be in line with one another.

Figure 7A:
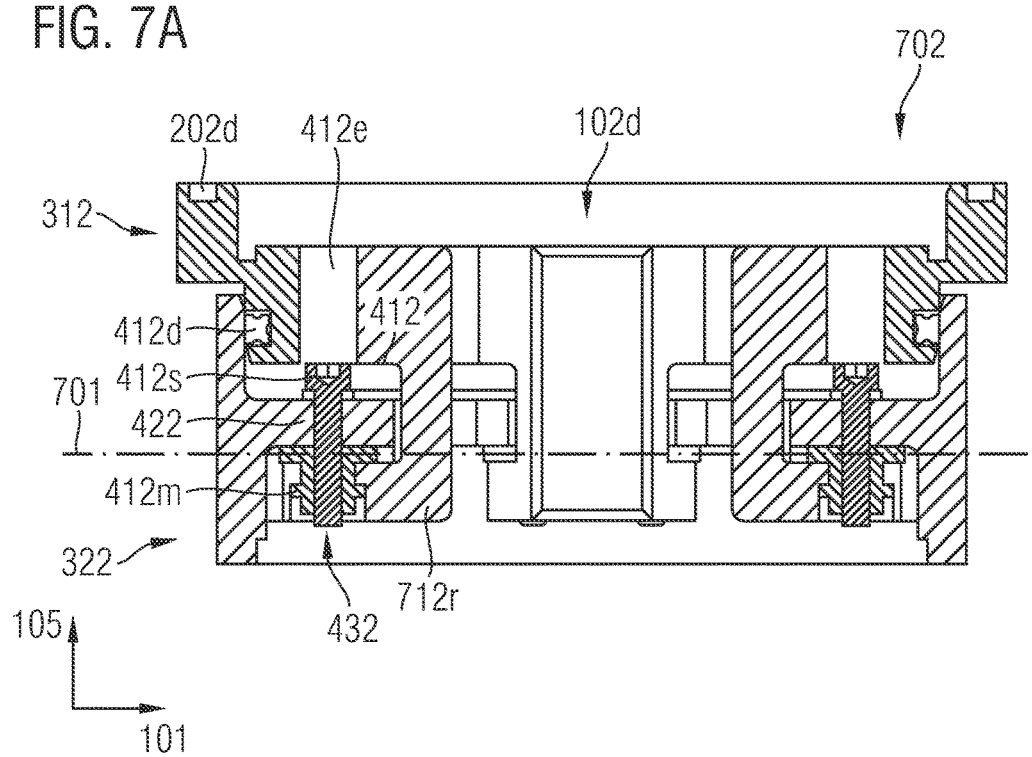
FIG. 7A and FIG. 7B respectively show a socket arrangement according to various embodiments in a schematic side view or cross-sectional view.
Figure 7B:
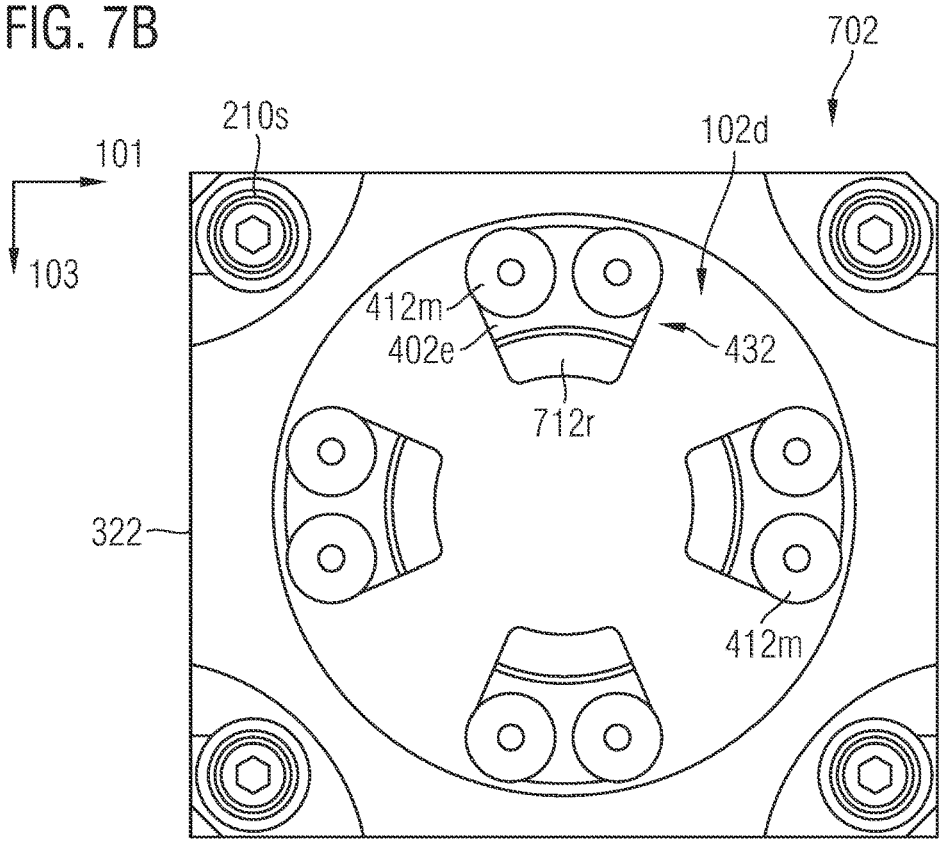

FIG. 7A illustrates a socket arrangement 702 according to various embodiments in a schematic cross-sectional view (analogous to FIG. 1A) and FIG. 7B illustrates the socket arrangement 702 according to various embodiments in a schematic cross-sectional view along a sectional plane 701.

A spring-elastic element in the form of a blind rivet nut 402m (for example of an elastomer) may be received in a through-opening in a wall portion of the groove 412. According to various embodiments, a spring-elastic element may be produced for example from an elastomer (for example in the form of a blind rivet nut 402m). The blind rivet nut 402m may have a through-opening with a thread (see FIG. 8A) for screwing a screw 412s into the blind rivet nut 402m. This allows a flexible/elastic fastening between the screw 412s and the wall portion of the groove 412 (an elastic screwed connection) to be realized. The end block 104 can consequently be moved flexibly in relation to the chamber wall 314w (for example along three translational and three rotational degrees of freedom), so that the rotational mounting (for example the rolling bearing) of the end block 104 is mechanically relieved.

According to various embodiments, the flexible/elastic fastening of the end block 104 can consequently be made possible by means of elastic blind rivet nuts 402m as connecting elements, wherein the blind rivet nuts 402m can make compliant screwing of the two socket elements 312, 322 to one another possible. This elastic screwed connection between the chamber wall 314w and the end block 104 may be realized for example by means of a number of blind rivet nuts 402m arranged on a pitch circle, as represented in FIG. 7B.

According to various embodiments, a blind rivet nut 402m may have a part extending radially beyond the rim of the through-opening in the wall portion of the groove 412 (known as a head support 812m, see FIG. 8A), which extends into the gap between the cover connection 312 and the intermediate adapter 322. The blind rivet nut 402m may be arranged in such a way that the head support of the blind rivet nut 402m can be subjected to axial loading. This makes it possible in the event of failure of one or more blind rivet nuts 402m, to prevent falling out of the screwed end block 104 (because of detachment of the intermediate adapter 322 from the cover connection 312).

Compliant screwing of the two socket elements 312, 322 to one another may be alternatively achieved by means of a spring (for example a metal spring or a plastic spring), into which the screw 412s can be screwed.

Furthermore, the cover connection 312 may have at the lower end (opposite from the first fastening arrangement 110) a machined recess. The lower circular ring 712r thus produced may be interrupted/milled out between every through-opening in the wall portions of the groove 412 (for example corresponding bores), in which a blind rivet nut 402*m* is received, and consequently be subdivided into a number of circular ring segments.

The lower circular ring 712*r* may for example have four circular ring segments, as represented in FIG. 7B. According to various embodiments, the lower circular ring 712*r* may have fewer than four, for example two or three, or else more than four, for example five or six, circular ring segments. The projection 422 of the intermediate adapter 322 may be formed, for example interrupted/milled out, to match, and consequently have an analogous number of segments, so that it can be introduced into the cover connection 312 (between the circular ring segments). Matching that, the distance of the circular ring segments from one another may be designed in such a way that the segments of the projection 422 of the intermediate adapter 322 can be inserted between the circular ring segments (along a direction perpendicular to the plane 701).

By means of a rotating movement (along the plane 701), the projection 422 inserted between the circular ring segments can then be introduced into the groove 412 of the cover connection 312, i.e. in other words the intermediate adapter 322 can be coupled to the cover connection 312 by means of an inserting/turning movement (analogous to a bayonet fastener).

For relieving the head support of the blind rivet nuts 402*m* (or for avoiding overloading), a spring-elastic element in the form of an elastic plate 402*e* (for example a rubber pad) may be arranged between a wall portion of the groove 412 and the projection 422. The elastic plate 402*e* may at least partially surround the head support of the blind rivet nuts 402*m* or be machined out appropriately for receiving the head support of the blind rivet nuts 402*m*. Consequently, the elastic plate 402*e* can absorb part of the force that can act on the head support of the blind rivet nuts 402*m* (also referred to as surface pressing). The elastic plate 402*e* may be formed from an elastic material, for example an elastomer (for example natural rubber).

Furthermore, the through-opening 102*d* in the socket arrangement 702 (which can define an interior of the socket arrangement 702) may be sealed off with respect to the exterior of the socket arrangement 702, for example of the processing chamber. For this purpose, the socket arrangement 702 may have a sealing structure 412*d* with a vacuum seal, for example a toroidal sealing ring, for example a quad ring 412*d*, as represented in FIG. 7A, or some other seal, such as for example an O-ring. The sealing structure 412*d* may be arranged between the interengaging portions of the cover connection 312 and the intermediate adapter 322. The sealing structure 412*d* may be arranged at a distance in relation to the insertion portions 422, 412. This allows the effect to be achieved that a relative movement between the cover connection 312 and the intermediate adapter 322 can be compensated, wherein a mass transfer, for example a gas exchange, which can for example impair the sputtering, between the interior of the socket arrangement 702 and the exterior of the socket arrangement 702 (for example the interior of the processing chamber) can be prevented or at least reduced by means of the sealing structure 412*d*.

Figure 8A:
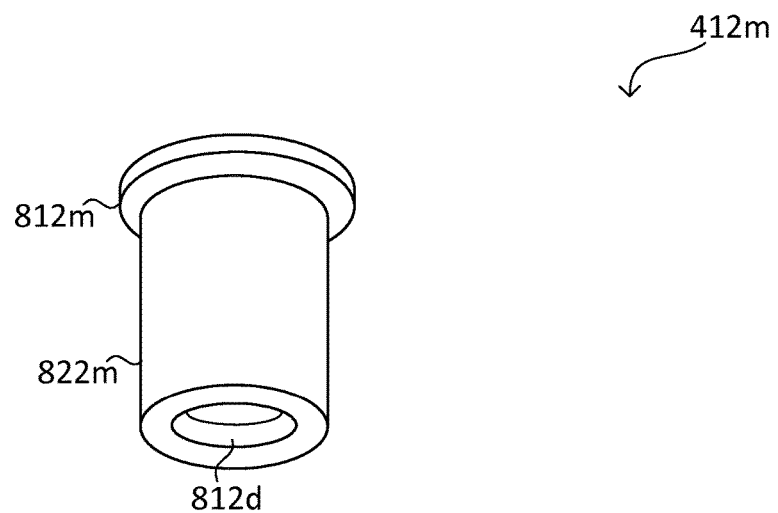
FIG. 8A shows a blind rivet nut according to various embodiments in a schematic perspective view.

FIG. 8A illustrates a spring-elastic element in the form of a blind rivet nut 402*m* (connecting element 402*m*) according to various embodiments in a schematic perspective view. The spring-elastic element 402*m* (the blind rivet nut 402*m*) may have a head support 812*m*, which extends in a radial direction away from a body 822*m* of the blind rivet nut 402*m*. The body 822*m* may take the form of a cylinder or a sleeve, as represented in FIG. 8A, or some other form, for example with a polygonal cross section or with thickenings.

The body 822*m* and the head support 812*m* may be penetrated by a common through-opening 812*d*. The inner wall of the through-opening 812*d* may for example be formed as an internal thread or be provided with some other kind of profiling (screwing portion), so that a screw can be screwed into the through-opening 812*d*. The spring-elastic element 402*m* (the blind rivet nut 402*m*) may for example be formed from a plastic, for example an elastomer.

Figure 8B:
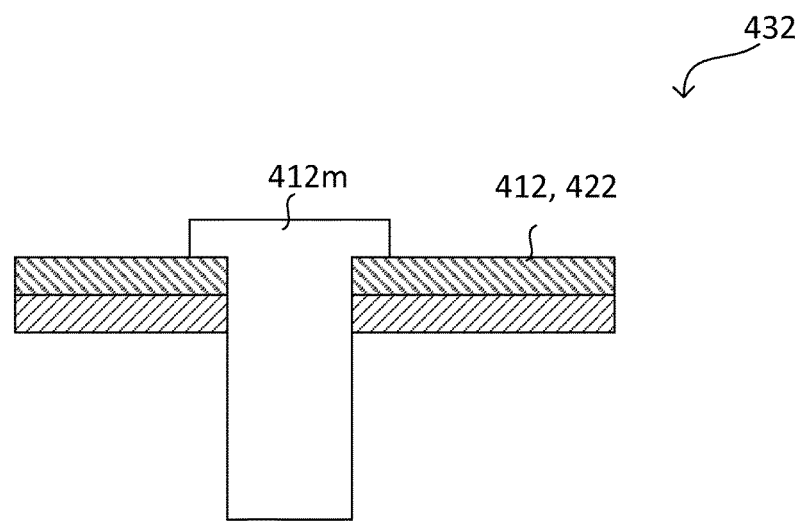
FIG. 8B shows a coupling structure according to various embodiments in a schematic cross-sectional view.

FIG. 8B illustrates a coupling structure 432 according to various embodiments in a schematic cross-sectional view. The blind rivet nut 402*m* may be arranged in an opening, for example a through-opening, in a plate-shaped portion of the socket arrangement or in a projection 412, 422 of the socket arrangement, such as that described herein. The blind rivet nut 402*m* may in this case be made to extend through the through-opening.

Figure 9A:
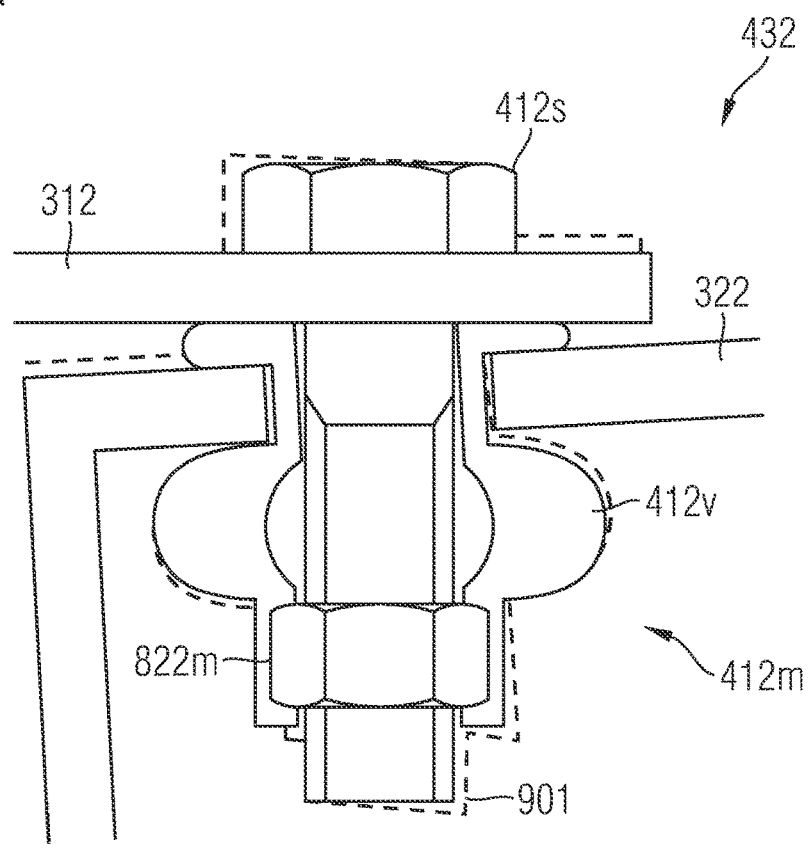
FIG. 9A shows a coupling structure according to various embodiments in a schematic cross-sectional view.

FIG. 9A illustrates a coupling structure 432 according to various embodiments in a schematic cross-sectional view. For connecting the cover connection 312 to the intermediate adapter 322, a screw 412*s* may be screwed in the blind rivet nut 402*m*. The blind rivet nut 402*m* may be designed in such a way that, when screwing in the screw 412*s*, a thickening 402*v* forms when the screw 412*s* is screwed into the through-opening 812*d* (for example on account of material displacement or compression of the body 822*m*). This allows the effect to be achieved that the blind rivet nut 402*m* can be fastened in a positively engaging manner in a through-opening matching it.

Furthermore, the blind rivet nut 402*m* may be elastic in such a way that a relative movement (represented as contour 901) between the cover connection 312 and the intermediate adapter 322 is made possible. On account of the relative movement between the cover connection 312 and the intermediate adapter 322, the blind rivet nut 402*m* may be deformed, so that it produces a restoring force, which is directed in the direction of a position of equilibrium between the cover connection 312 and the intermediate adapter 322, wherein all of the restoring forces cancel one another out in the position of equilibrium. Illustratively, the blind rivet nut 402*m* can be deformed the least in the position of equilibrium (also known as the position of rest).

According to various embodiments, the spring-elastic element can define a position of rest of the second socket element 322 in relation to the first socket element 312.

Figure 9B:
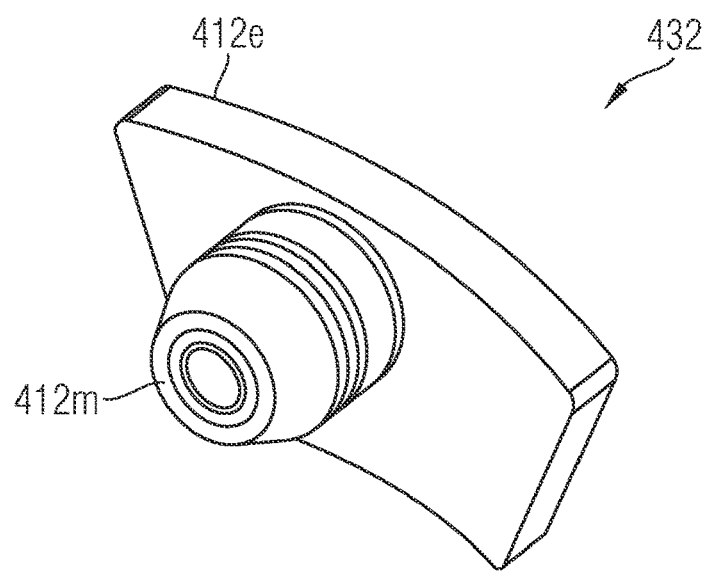
FIG. 9B shows a coupling structure according to various embodiments in a schematic perspective view.

FIG. 9B illustrates a coupling structure 432 according to various embodiments in a schematic perspective view. According to various embodiments, the blind rivet nut 402*m* and the elastic plate 402*e* may be formed as one part (or in one piece). Illustratively, the head support of the blind rivet nut 402*m* may be formed to match the gap between the cover connection 312 and the intermediate adapter 322 and form the elastic plate 402*e*.

Figure 10:
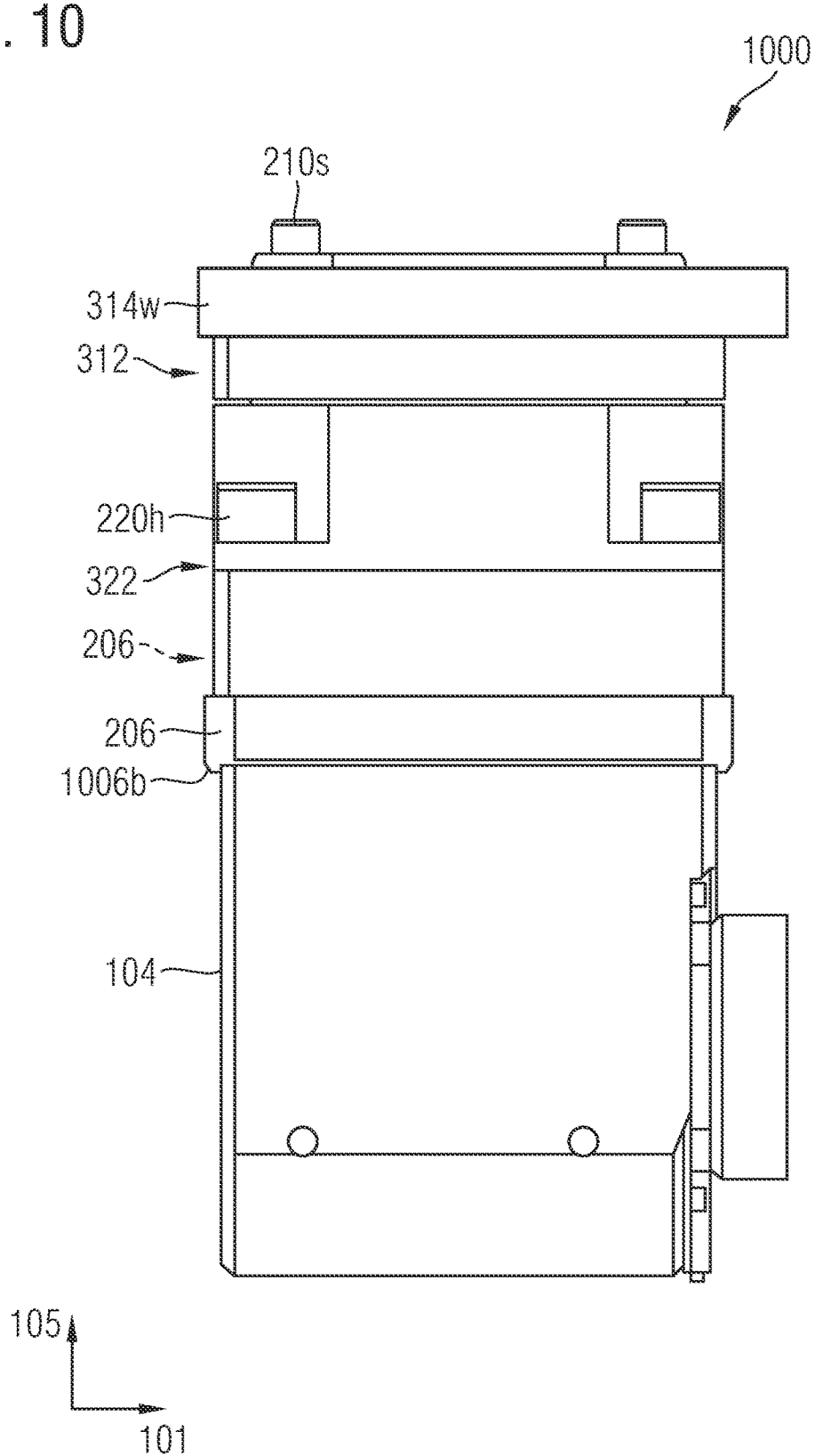
FIG. 10 shows an end block arrangement according to various embodiments in a schematic side view or cross-sectional view.

FIG. 10 illustrates an end block arrangement 1000 according to various embodiments in a schematic side view or cross-sectional view (analogous to FIG. 1A).

According to various embodiments, a socket arrangement described herein may be screwed with an intermediate adapter 322 and a cover connection 312 as a contiguous assembly (known as a screw-on kit) on a chamber wall 314*w* (for example a magnetron cover). At the other end of the socket arrangement, opposite from the chamber wall 314*w*, an end block 104 may be subsequently screwed with the screw-on kit.

According to various embodiments, the spacing element 206 can be in the form of a plate and consist of electrically and/or thermally insulating material (known as an insulating plate). The spacing element 206 may have a centering structure 1006b in the form of a projection (known as a centering collar 1006b), in which the end block 104, or the basic housing 104b of the end block 104, can be inserted. This allows the effect to be achieved that the relative position of the end block 104 in relation to the spacing element 206 is predefined by means of the centering collar 1006b. Illustratively, the centering collar 1006b may bring about a self-centering of the end block 104 on the spacing element 206.

Figure 11:
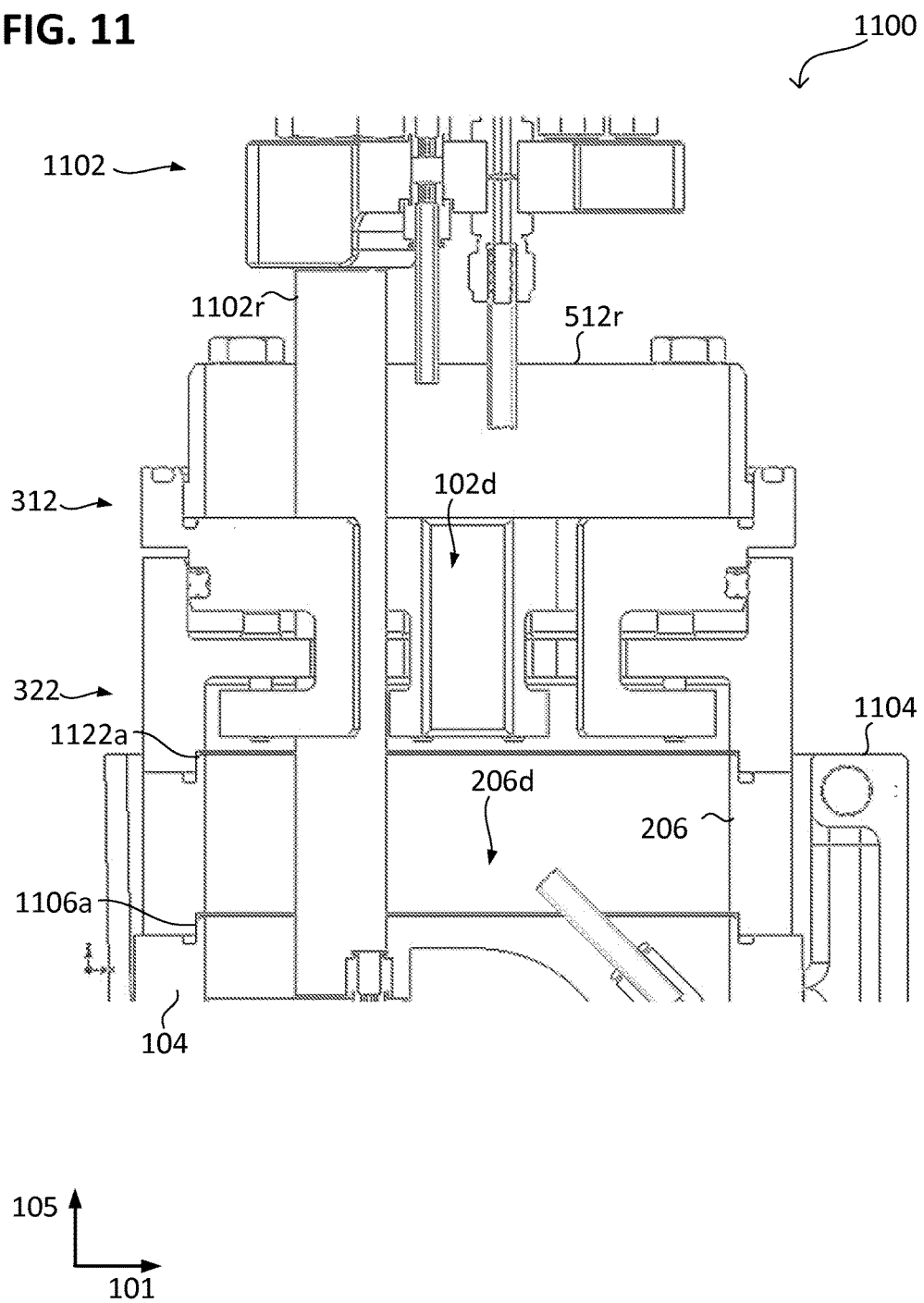
FIG. 11 and FIG. 12 respectively show an end block arrangement according to various embodiments in a schematic cross-sectional view.
Figure 12:
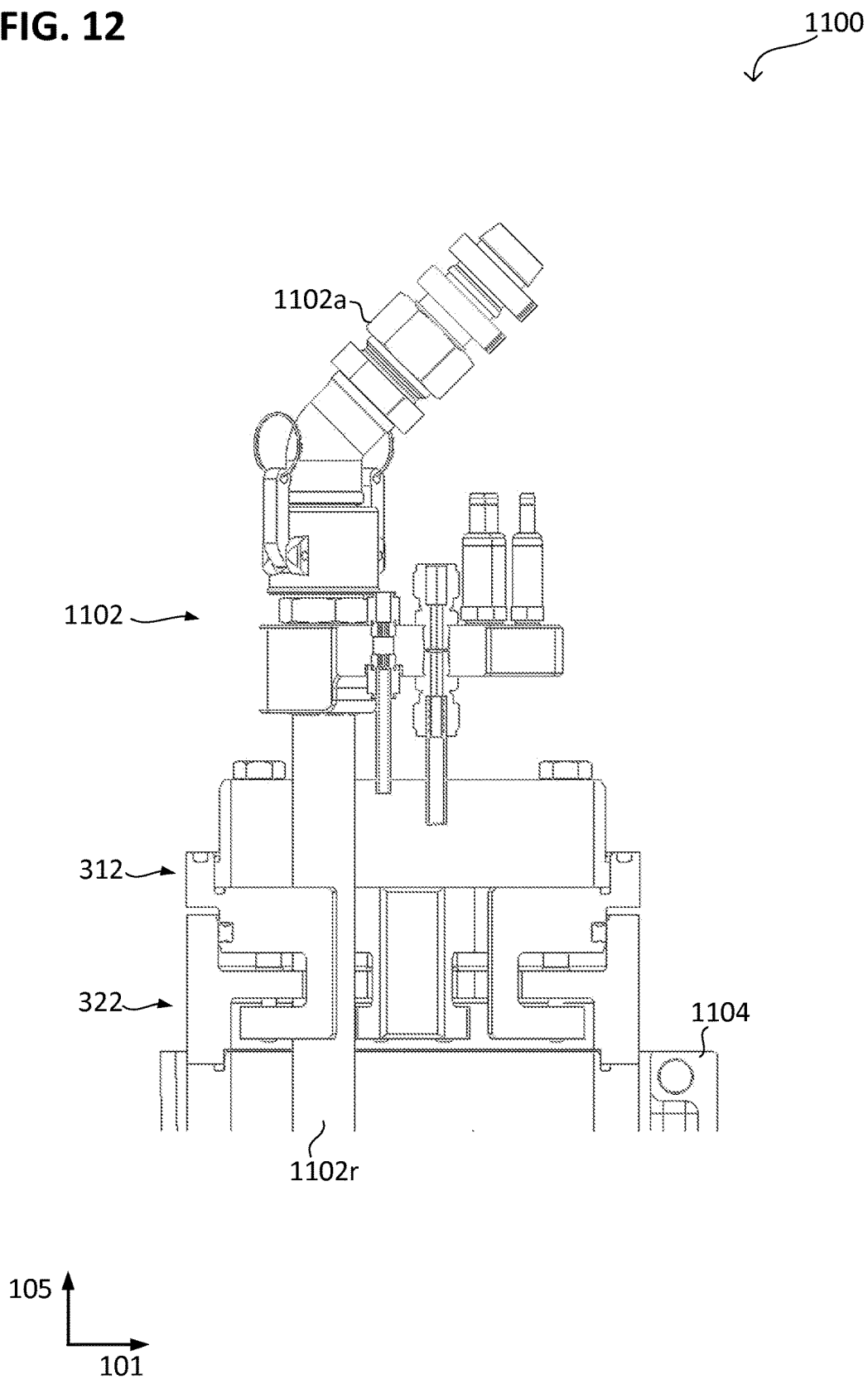

FIG. 11 and FIG. 12 respectively illustrate an end block arrangement 1100 with a socket arrangement, as described herein, according to various embodiments in a schematic cross-sectional view (analogous to FIG. 1A).

The end block 104 may be designed for example as a media end block and have components (which form a supplying arrangement 1102) for supplying a medium to the tubular cathode, such as for example a pipeline 1102r (as part of a coolant feed) or an electrical line (as part of the electrical feed). The coolant feed may be sealed off with respect to the interior of the vacuum chamber by means of a seal, for example by means of a rotary bushing. For example, the interior of the end block 104 may be at atmospheric pressure or a coolant feed in the interior of the end block 104 may be at a greater pressure than atmospheric pressure and be sealed off with respect to the interior of the processing chamber.

It may therefore be necessary to make the end block 104, or the basic housing 104b, solid and stable (for example pressure-stable) and to connect it for example to the processing chamber or part of the vacuum chamber. The basic housing 104b may for example be formed from a metal, for example from steel or an aluminum alloy. Illustratively, the basic housing 104b of the end block 104 may act as part of the chamber wall 314w and be designed for separating a vacuum and atmospheric pressure.

The cover connection 312 and the intermediate adapter 322 may be designed in such a way, for example the circular ring segments may be arranged at such a distance, that a supplying arrangement 1102, for example a pipeline 1102r, fits between the circular ring segments, as represented in FIG. 11. For example, the pipeline 1102r may be fastened on the end block 104 and be mounted together with the end block 104. The supplying arrangement 1102 may also have an electrical line, which may be fastened on the pipeline 1102r. In the mounted state of the end block 104, the pipeline 1102r may be made to extend through the chamber wall 314w.

Furthermore, the pipeline 1002r may have corresponding connections 1102a for connecting the pipeline 1002r to a cooling water supply, for example to a circulating pump or an equalizing tank, which can feed coolant, for example water, to the pipeline 1002r.

According to various embodiments, the intermediate adapter 322 may have a centering structure 1122a in the form of a recess, in which the spacing element 206 can be inserted. By analogy therewith, the spacing element 206 may have a centering structure 1106a in the form of a recess, in which the end block 104 can be inserted. This allows the effect to be achieved that the relative position of the end block 104 in relation to the intermediate adapter 322, or the chamber wall 314w, is predefined. Illustratively, the centering structure 1106a, 1122a can bring about a self-centering of the end block 104 on the socket arrangement.

Example 1 is a socket arrangement 102, 152, 202, 302, 402, 452, 502, 602, 702 for holding (or e.g. fastening) an end block 104 on a process chamber, the socket arrangement 102, 152, 202, 302, 402, 452, 502, 602, 702 may include:

a first socket element 312
    with a first fastening arrangement 110 for fastening the first socket element 312 on a process chamber wall and
    with a second fastening arrangement 102a; and a second socket element 322
    with a first fastening arrangement 102b, for fastening the second socket element 322 on the first socket element 322 and
    with a second fastening arrangement 120 for fastening an end block 104 on the second socket element 322;
wherein the second fastening arrangement 102a of the first socket element 312 and the first fastening arrangement 102b of the second socket element 322 are formed for engaging in one another with play in such a way (e.g. with an allowance for clearance) that the second socket element 322 is deflectable (e.g. with a degree of freedom of movement, or displaceable) in relation to the first socket element 312.

For reasons of clarity, the first fastening arrangement 102b of the second socket element 322 may be referred to as third fastening arrangement 102b. Further, the second fastening arrangement 120 of the second socket element 322 may be referred to as fourth fastening arrangement 102b.

Example 2: The socket arrangement 102, 152, 202, 302, 402, 452, 502, 602, 702 of example 1, wherein the second fastening arrangement 102a of the first socket element 312 and the first fastening arrangement 102b of the second socket element 322 are designed to be releasably insertable in one another.

Example 3: The socket arrangement 102, 152, 202, 302, 402, 452, 502, 602, 702 of example 1 or example 2, wherein the second fastening arrangement 120 of the second socket element 322 for fastening an end block 104 on the second socket element 322 is formed separately from the first fastening arrangement 110 of the first socket element 312.

In example 4, the socket arrangement 102, 152, 202, 302, 402, 452, 502, 602, 702 of any one of examples 1 to 3 may optionally include a sealing structure 412d for sealing off a gap between the first socket element 312 and the second socket element 322, wherein the sealing structure 412d is arranged between portions of the first socket element 312 and the second socket element 322 that are adjacent one another.

Example 5: The socket arrangement 102, 152, 202, 302, 402, 452, 502, 602, 702 of example 4, wherein the first socket element 312 has a further sealing region for sealing off with respect to a process chamber wall 314w and wherein the second socket element 322 has a further sealing region for sealing off a connection to the end block 104.

In example 6: The socket arrangement 102, 152, 202, 302, 402, 452, 502, 602, 702 of any one of examples 1 to 5 may optionally include a spring-elastic element 402m, 402e (also referred to as elastic element or resilient element), which is arranged between the first socket element 312 and the second socket element 322, so that the second socket element 322 is deflectable in relation to the first socket element 312 against a restoring force.

Example 7: The socket arrangement 102, 152, 202, 302, 402, 452, 502, 602, 702 of example 6, wherein the first fastening arrangement 110 of the first socket element 312 has a radially outwardly protruding projection and the second fastening arrangement 102a of the second socket element 322 has a radially inwardly protruding projection, which when fitted together overlap one another, and wherein the spring-elastic element 402m, 402e is arranged between the projections.

In Example 8: The socket arrangement 102, 152, 202, 302, 402, 452, 502, 602, 702 of any one of examples 1 to 7 may optionally include: a spacing element 206, which can be applied to the second fastening arrangement 120 of the second socket element 322 and defines a distance between the second socket element 322 and an end block 104 to be fastened on it.

Example 9: The socket arrangement 102, 152, 202, 302, 402, 452, 502, 602, 702 of example 8, wherein the spacing element 206 includes a thermally and/or electrically insulating material 206i for thermally and/or electrically insulating the second socket element 322 from an end block 104 to be fastened on it.

In Example 10, the socket arrangement 102, 152, 202, 302, 402, 452, 502, 602, 702 of any one of examples 1 to 9 may optionally include: a connecting element 412s, which penetrates the second fastening arrangement 102a of the first socket element 312 and the first fastening arrangement 102b of the second socket element 322.

Example 11: The socket arrangement 102, 152, 202, 302, 402, 452, 502, 602, 702 of any one of examples 1 to 10, wherein the second fastening arrangement 102a of the first socket element 312 and the first fastening arrangement 102b of the second socket element 322 surround a through-opening 102d penetrating the socket arrangement 102, 152, 202, 302, 402, 452, 502, 602, 702 for receiving a supplying arrangement 1102.

Example 12: The socket arrangement 102, 152, 202, 302, 402, 452, 502, 602, 702 of any one of examples 6 to 11, wherein the second fastening arrangement 102a of the first socket element 312 and/or the first fastening arrangement 102b of the second socket element 322 have/has an opening, into which the spring-elastic element 402m, 402e protrudes and forms a connecting element for connecting the spring-elastic element 402m, 402e to another connecting element.

Example 13 is an end block arrangement including: at least one end block 104 for rotatably mounting and supplying a medium to a tubular cathode; a socket arrangement 102, 152, 202, 302, 402, 452, 502, 602, 702 for holding the end block 104; wherein the socket arrangement 102, 152, 202, 302, 402, 452, 502, 602, 702 has a first fastening arrangement 110 for connecting the socket arrangement 102, 152, 202, 302, 402, 452, 502, 602, 702 to a wall element 314w; and wherein the socket arrangement 102, 152, 202, 302, 402, 452, 502, 602, 702 has a second fastening arrangement 120 for connecting the socket arrangement 102, 152, 202, 302, 402, 452, 502, 602, 702 to the end block 104, wherein the second fastening arrangement 120 has a through-opening 120d, which penetrates a projection 102v of the socket arrangement 102, 152, 202, 302, 402, 452, 502, 602, 702, wherein the second fastening arrangement 120 for fastening the end block 104 is formed separately from the first fastening arrangement 110.

What is claimed is:

1. A socket arrangement for holding an end block on a process chamber, the socket arrangement comprising:
a first socket element and a second socket element,
the first socket element comprising:
a first fastening arrangement for fastening the first socket element on a process chamber wall and a second fastening arrangement,
the second socket element comprising:
a third fastening arrangement for fastening the second socket element on the first socket element and a fourth fastening arrangement for fastening an end block on the second socket element;
wherein the second fastening arrangement of the first socket element and the third fastening arrangement of the second socket element are formed for interlocking with one another with play so that the second socket element is deflectable in relation to the first socket element;
wherein the second fastening arrangement of the first socket element has a radially outwardly protruding projection and the third fastening arrangement of the second socket element has a radially inwardly protruding projection, the radially inwardly protruding projection and the radially outwardly protruding projection overlap each other when interlocked, and
wherein the second fastening arrangement and the third fastening arrangement are of an interlocking fastening type;
and wherein the first fastening arrangement and/or the fourth fastening arrangement are of an wall mount fastening type.

2. The socket arrangement of claim 1,
wherein the second fastening arrangement of the first socket element and the third fastening arrangement of the second socket element are designed to be releasably insertable in one another.

3. The socket arrangement of claim 1,
wherein the fourth fastening arrangement of the second socket element for fastening the end block on the second socket element is formed separately from the first fastening arrangement of the first socket element.

4. The socket arrangement of claim 1, further comprising:
a sealing structure for sealing off a gap between the first socket element and the second socket element, wherein the sealing structure is arranged between portions of the first socket element and the second socket element that are adjacent one another.

5. The socket arrangement of claim 4,
wherein the first socket element has a further sealing region for sealing off with respect to a process chamber wall and wherein the second socket element has a further sealing region for sealing off a connection to the end block.

6. The socket arrangement of claim 1, further comprising:
an elastic element that is configured to provide a restoring force in response to deforming the elastic element,
wherein the elastic element is arranged between the first socket element and the second socket element, so that the second socket element is centered in relation to the first socket element by the restoring force.

7. The socket arrangement of claim 6,
wherein the elastic element is arranged between the radially inwardly protruding projection and the radially outwardly protruding projection.

8. The socket arrangement of claim 1, further comprising:
a spacing element, which is applicable to the fourth fastening arrangement of the second socket element and defines a distance between the second socket element and the end block to be fastened to the second socket element.

9. The socket arrangement of claim 8,
wherein the spacing element comprises a thermally and/or electrically insulating material for thermally and/or electrically insulating the second socket element from the end block to be fastened at the second socket element.

10. The socket arrangement of claim 1, further comprising:
a connecting element, which penetrates the radially inwardly protruding projection and the radially outwardly protruding projection.

11. The socket arrangement of claim 1, further comprising:
- a through-opening for receiving a supplying arrangement, the through-opening extending through the socket arrangement along a first axis;
- wherein the second fastening arrangement of the first socket element and the third fastening arrangement of the second socket element surround the through-opening;
- wherein the second socket element is deflectable in relation to the first socket element around a second axis different from the first axis.

12. The socket arrangement of claim 6,
- wherein the second fastening arrangement of the first socket element and/or the third fastening arrangement of the second socket element have/has an opening,
- into which the elastic element protrudes and forms a connecting element for connecting the elastic element to another connecting element.

13. The socket arrangement of claim 1,
- wherein the interlocking fastening type provides for a joint type deflection.

14. The socket arrangement of claim 1,
- wherein the wall mount fastening type provides for a stationary attachment.

15. The socket arrangement of claim 1,
- wherein, in relation to the first socket element, the second socket element is deflectable by a swiveling motion.

16. The socket arrangement of claim 1,
- wherein the second and third fastening arrangements are arranged between the first and fourth fastening arrangements.

17. The socket arrangement of claim 1,
- wherein the second and third fastening arrangements are arranged at first sides of the first and second socket elements facing each other; and
- wherein the first and fourth fastening arrangements are arranged at second sides of the first and second socket element opposite the respective first sides.

18. The socket arrangement of claim 1,
- wherein the interlocking with play provides multiple degrees of freedom, so that the second socket element is deflectable along each of the multiple degrees of freedom in relation to the first socket element.

19. A socket arrangement for holding an end block on a process chamber,
- the socket arrangement comprising:
- a first socket element and a second socket element,
- the first socket element comprising:
- a first fastening arrangement for fastening the first socket element on a process chamber wall and a second fastening arrangement,
- the second socket element comprising:
- a third fastening arrangement for fastening the second socket element on the first socket element and a fourth fastening arrangement for fastening an end block on the second socket element;
- wherein the second fastening arrangement of the first socket element and the third fastening arrangement of the second socket element are formed for interlocking with each other with play providing multiple degrees of freedom, so that the second socket element is deflectable along each of the multiple degrees of freedom in relation to the first socket element;
- wherein the second fastening arrangement of the first socket element has a radially outwardly protruding projection and the third fastening arrangement of the second socket element has a radially inwardly protruding projection, the radially inwardly protruding projection and the radially outwardly protruding projection overlap each other when interlocked, and
- wherein the second fastening arrangement and the third fastening arrangement are of an interlocking fastening type;
- and wherein the first fastening arrangement and/or the fourth fastening arrangement are of an wall mount fastening type.

* * * * *